United States Patent
Nagao

(10) Patent No.: US 10,109,355 B2
(45) Date of Patent: Oct. 23, 2018

(54) SEMICONDUCTOR MEMORY DEVICE AND MEMORY SYSTEM

(71) Applicant: Toshiba Memory Corporation, Tokyo (JP)

(72) Inventor: Osamu Nagao, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,969

(22) Filed: Sep. 4, 2017

(65) Prior Publication Data

US 2018/0261291 A1    Sep. 13, 2018

(30) Foreign Application Priority Data

Mar. 7, 2017  (JP) .................................. 2017-042499

(51) Int. Cl.

| G11C 8/00 | (2006.01) |
|---|---|
| G11C 16/12 | (2006.01) |
| G11C 16/04 | (2006.01) |
| G11C 11/56 | (2006.01) |
| G11C 16/34 | (2006.01) |
| H01L 27/115 | (2017.01) |
| G11C 16/08 | (2006.01) |
| G11C 16/26 | (2006.01) |

(52) U.S. Cl.
CPC .......... *G11C 16/12* (2013.01); *G11C 11/5642* (2013.01); *G11C 16/0483* (2013.01); *G11C 16/08* (2013.01); *G11C 16/26* (2013.01); *G11C 16/34* (2013.01); *H01L 27/115* (2013.01)

(58) Field of Classification Search
CPC ..... G11C 16/12; G11C 16/0483; G11C 16/34; G11C 16/10; G11C 16/08; G11C 16/26; G11C 11/5642
USPC ............. 365/230.05, 185.17, 185.18, 185.22
See application file for complete search history.

(56) References Cited

U.S. PATENT DOCUMENTS

| 8,593,872 B2 * | 11/2013 | Shirakawa .......... G11C 11/5628 365/185.11 |
|---|---|---|
| 9,257,188 B2 | 2/2016 | Fujita et al. |
| 2017/0052732 A1 * | 2/2017 | Oh ...................... G11C 11/5628 |

* cited by examiner

*Primary Examiner* — Gene Auduong
(74) *Attorney, Agent, or Firm* — Patterson & Sheridan, LLP

(57) ABSTRACT

A semiconductor memory device includes a memory cell array having a plurality of memory cell groups, the memory cell groups including a first memory group including first memory cells, and a control circuit configured to execute a first write operation targeting the first memory cells in a first mode in which the control circuit executes at least a first programming operation on the first memory cells followed by a multiple number of first verification operations to verify the first programming operation, and then in a second mode, in which the control circuit executes a second programming operation on the first memory cells followed by a second verification operation to verify the second programming operation. A programming voltage applied during the second programming operation is less than a programming voltage applied during the first programming operation, and is adjusted based on a number of first verification operations.

20 Claims, 19 Drawing Sheets

FIG. 8

| VERIFY LOOP | | NUMBER OF TIMES OF PROGRAM LOOPS | |
|---|---|---|---|
| NUMBER OF TIMES | VOLTAGE | ONCE | TWICE |
| 2 | VCG_SV+DVCG | VOS1_2 | VOS2_2 |
| 3 | VCG_SV+2·DVCG | VOS1_3 | VOS2_3 |
| 4 | VCG_SV+3·DVCG | VOS1_4 | VOS2_4 |
| 5 | VCG_SV+4·DVCG | VOS1_5 | VOS2_5 |

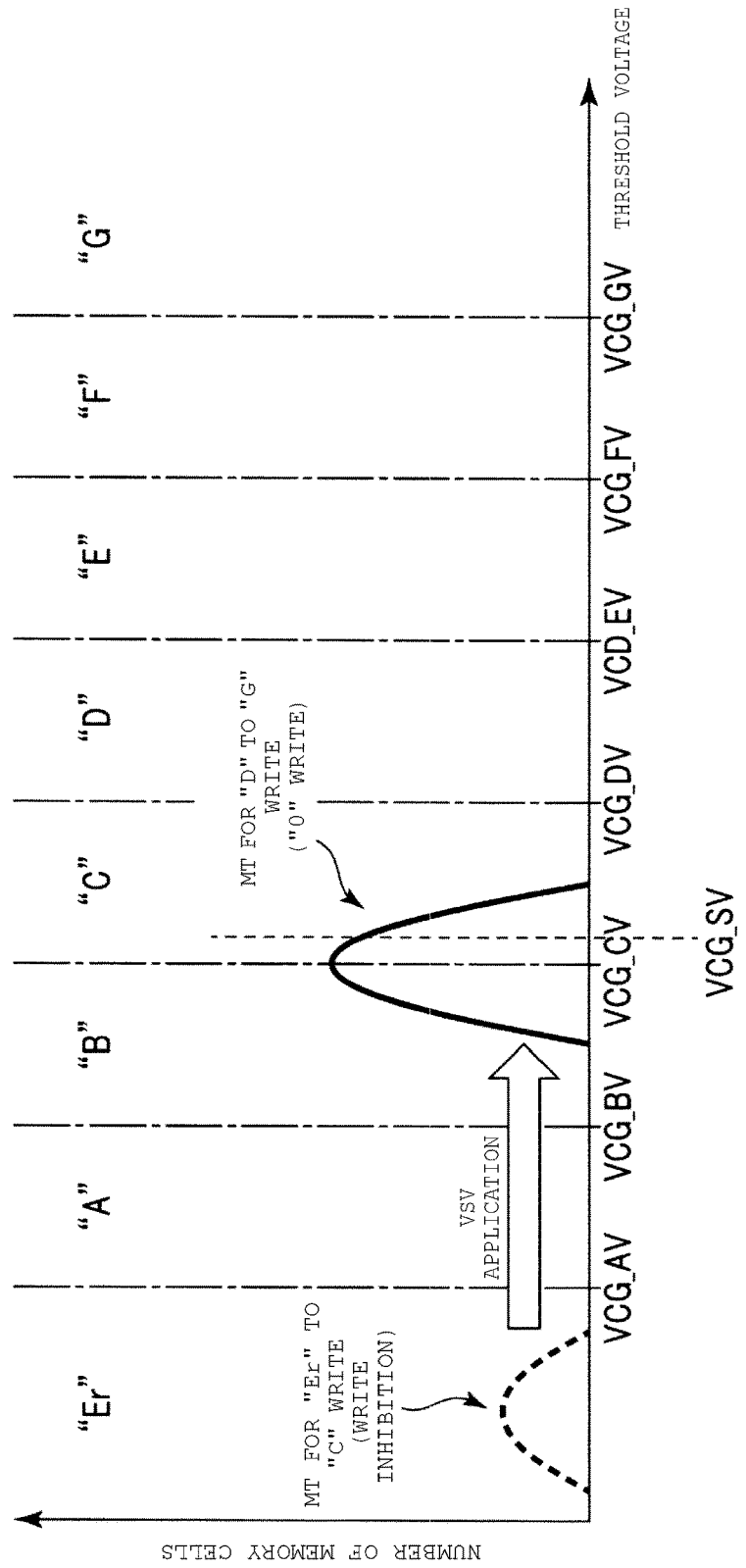

SEMICONDUCTOR MEMORY DEVICE AND MEMORY SYSTEM

CROSS-REFERENCE TO RELATED APPLICATION

This application is based upon and claims the benefit of priority from Japanese Patent Application No. 2017-042499, filed Mar. 7, 2017, the entire contents of which are incorporated herein by reference.

FIELD

Embodiments described herein relate generally to a semiconductor memory device and a memory system.

BACKGROUND

As a semiconductor memory device, NAND flash memory is known.

DESCRIPTION OF THE DRAWINGS

FIG. 8 is an offset table provided in the semiconductor memory device according to the first embodiment.

FIG. 22 is an explanatory diagram of a sampling mode in a semiconductor memory device according to a first modification example.

DETAILED DESCRIPTION

Figure 1:
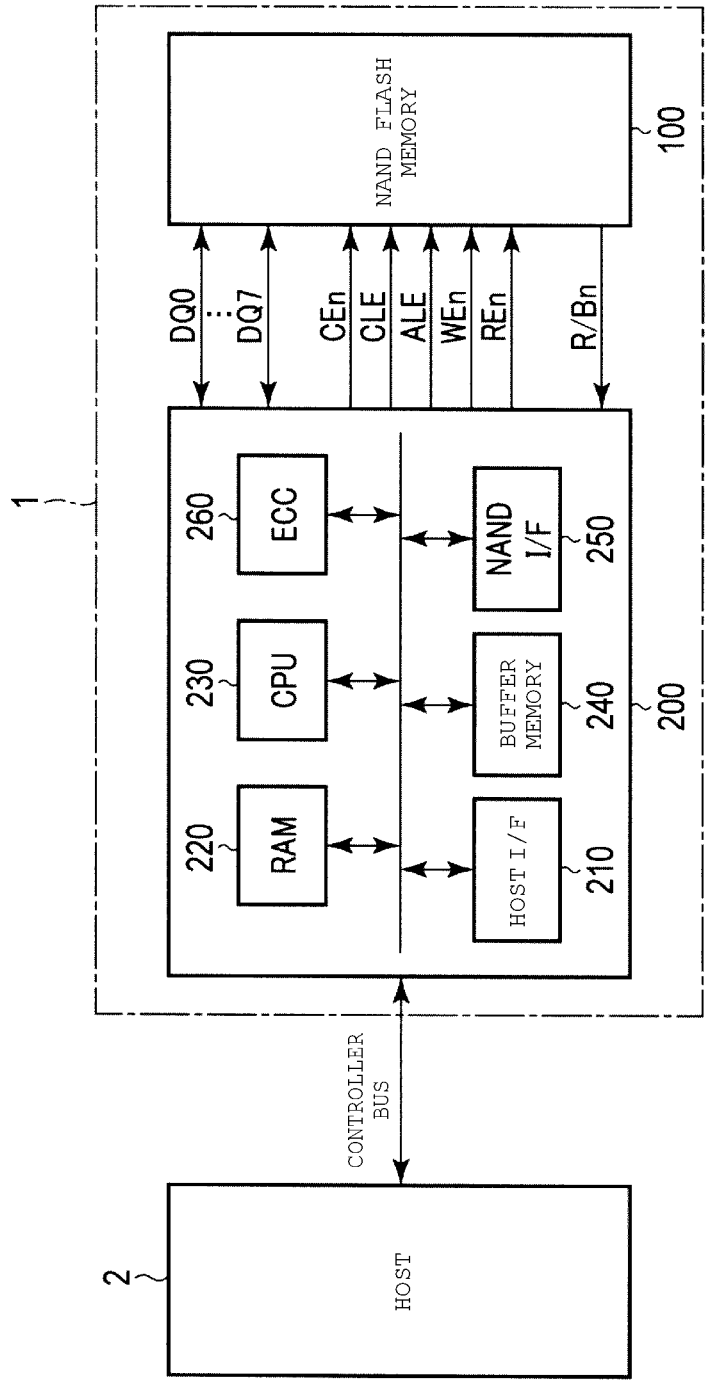
FIG. 1 is a block diagram of a memory system according to a first embodiment.

Embodiments provide a semiconductor memory device and a memory system capable of enhancing processing capability.

In general, according to one embodiment, a semiconductor memory device includes a memory cell array having a plurality of memory cell groups, each of which includes a plurality of memory cells, the memory cell groups including a first memory group including first memory cells and a second memory group including second memory cells, a first word line that is connected to each of the first memory cells, a second word line that is connected to each of the second memory cells, and a control circuit configured to execute a first write operation targeting the first memory cells in a first mode in which the control circuit executes at least a first programming operation on the first memory cells followed by a multiple number of first verification operations to verify the first programming operation, and then in a second mode, in which the control circuit executes a second programming operation on the first memory cells followed by a second verification operation to verify the second programming operation. A programming voltage applied to the first word line during the second programming operation is less than a programming voltage applied to the first word line during the first programming operation, and is adjusted based on a number of first verification operations.

In the following, embodiments of the present disclosure will be described with reference to the drawings. In the following description, common reference numerals are given to common portions in all the drawings.

1. First Embodiment

A semiconductor memory device and a memory system according to a first embodiment will be described. In the following, as the semiconductor memory device, a three-dimensional stacked NAND flash memory in which memory cell transistors are three-dimensionally stacked above a semiconductor substrate will be described by way of an example.

1.1 Configuration

1.1.1 Entire Configuration of Memory System

First, an entire configuration of a memory system according to a first embodiment will be described using FIG. 1.

As illustrated in FIG. 1, a memory system 1 includes a NAND flash memory 100 and a controller 200. The controller 200 and the NAND flash memory 100, for example, may form a single semiconductor memory device by being combined with each other, and a memory card such as a SD™ card, a solid state drive (SSD) or the like may be provided as an example of the semiconductor memory device.

The NAND flash memory 100 includes a plurality of memory cell transistors and stores data in a non-volatile manner.

The NAND flash memory 100 is connected to the controller 200 by a NAND bus and operates based on an instruction from the controller 200. More specifically, the NAND flash memory 100 transmits and receives input/output signal I/O of, for example, 8-bit to and from the controller 200 through data lines DQ0 to DQ7. The input/output signal I/O is, for example, data, an address, and a command. The NAND flash memory 100 receives, for example, a chip enable signal CEn, a command latch enable signal CLE, an address latch enable signal ALE, a write enable signal WEn, and a read enable signal REn from the controller 200. The NAND flash memory 100 transmits a ready/busy signal R/Bn to the controller 200.

The chip enable signal CEn is a signal for enabling the NAND flash memory 100 and is asserted, for example, at a Low ("L") level. The command latch enable signal CLE is a signal indicating that the input/output signal I/O is the command and is asserted, for example, at a High ("H") level. The address latch enable signal ALE is a signal indicating that the input/output signal I/O is an address and is asserted, for example, at the "H" level. The write enable signal WEn is a signal for fetching the received signal into the NAND flash memory 100 and is asserted, for example, at the "L" level each time when the command, the address, data, or the like is received from the controller 200. Accordingly, each time when the signal WEn is toggled, the input/output signal I/O is fetched into the NAND flash memory 100. The read enable signal REn is a signal to be used for reading data from the NAND flash memory 100 by the controller 200. The read enable signal REn is asserted, for example, at the "L" level. The ready/busy signal R/Bn is a signal indicating whether the NAND flash memory 100 is in a busy state or not (i.e., whether the controller 200 is in a state incapable of receiving a command or capable of receiving a command) and goes to the becomes "L" level, for example, when the NAND flash memory 100 is in the busy state.

The controller 200 instructs the NAND flash memory 100 to read, write, erase, or the like data in response to an instruction received from the host device 2. The controller 200 manages memory space of the NAND flash memory 100.

The controller 200 includes a host interface circuit 210, a built-in memory (RAM) 220, a processor (CPU) 230, a buffer memory 240, a NAND interface circuit 250, and an error checking and correcting (ECC) circuit 260.

The host interface circuit 210 is connected to the host device 2 through a controller bus and manages communication with the host device 2. The host interface circuit 210 transfers an instruction and data received from the host device 2 to the processor 230 and the buffer memory 240, respectively. The host interface circuit 210 transfers data within the buffer memory 240 to the host device 2 in response to the instruction of the processor 230.

The NAND interface circuit 250 is connected to the NAND flash memory 100 through the NAND bus and manages communication with the NAND flash memory 100.

The NAND interface circuit 250 transfers the instruction received from the processor 230 to the NAND flash memory 100. The NAND interface circuit 250 transfers write data within the buffer memory 240 to the NAND flash memory 100 at the time of write. Furthermore, the NAND interface circuit 250 transfers data read from the NAND flash memory 100 to the buffer memory 240 at the time of read.

The processor 230 controls the entire operation of the controller 200. For example, when a write instruction is received from the host device 2, the processor 230 outputs a write instruction to the NAND flash memory 100 in response to the reception of write instruction. The operation to be performed when a read instruction or an erase instruction is received is also similar. The processor 230 executes various processing for managing the NAND flash memory 100, such as wear leveling. The processor 230 executes various operations. For example, the processor 230 executes data encryption processing, data randomization processing, or the like.

The ECC circuit 260 executes error checking and correcting (ECC) of data.

The built-in memory 220 is, for example, a semiconductor memory such as DRAM is used as a working area of the processor 230. The built-in memory 220 holds firmware for managing the NAND flash memory 100, various management tables, and the like.

1.1.2 Configuration of Semiconductor Memory Device

Next, a configuration of the NAND flash memory 100 will be described using FIG. 2.

Figure 2:
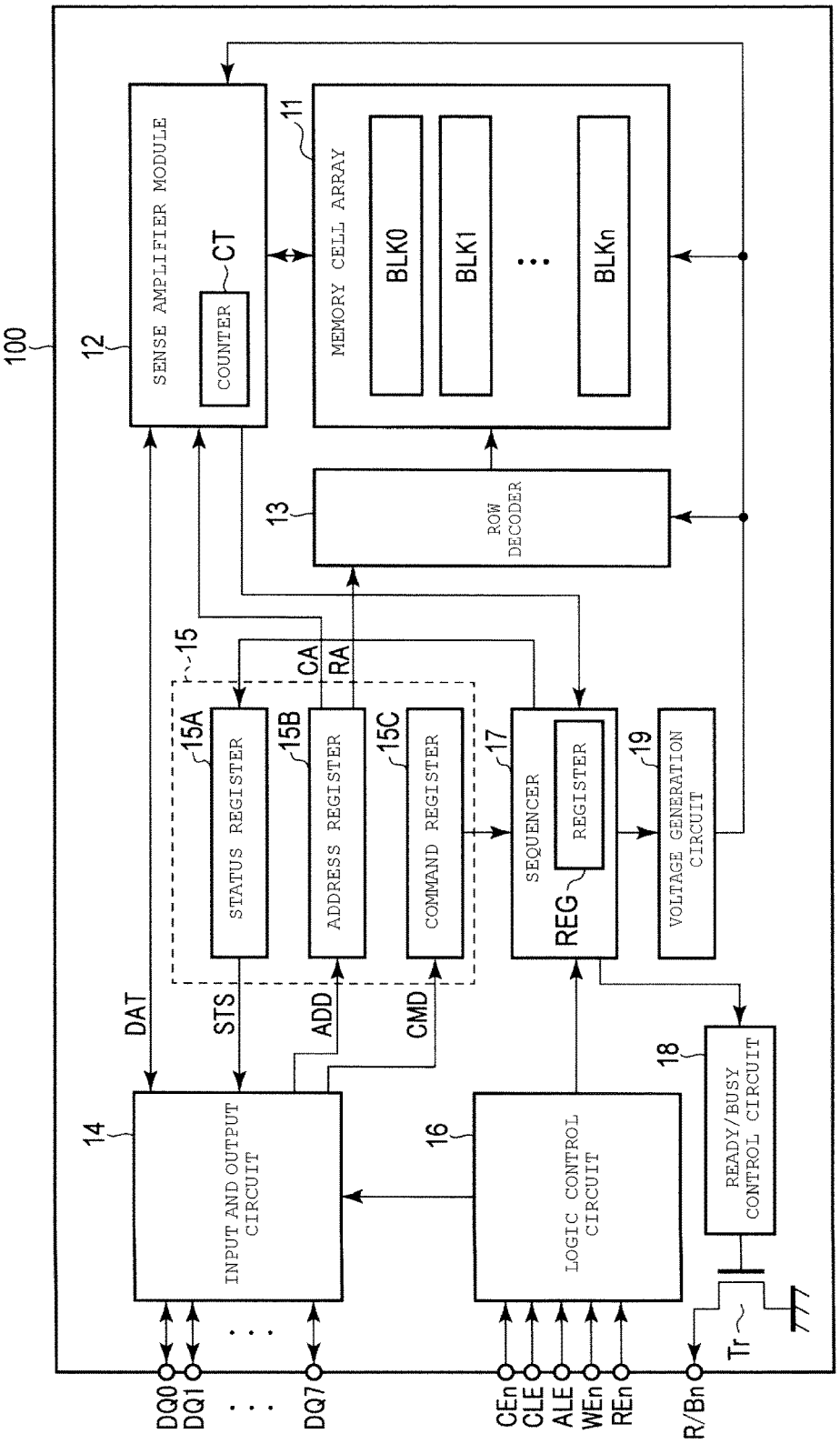
FIG. 2 is a block diagram of a semiconductor memory device according to the first embodiment.

As illustrated in FIG. 2, the NAND flash memory 100 includes a memory cell array 11, a sense amplifier module 12, a row decoder 13, an input and output circuit 14, a register 15, a logic control circuit 16, a sequencer 17, a ready/busy control circuit 18, and a voltage generation circuit 19. In an example of FIG. 2, a portion of connections between respective blocks is illustrated for simplifying description.

The memory cell array 11 includes blocks BLK0 to BLKn (n is a natural number of 1 or more). The block BLK is a set of a plurality of nonvolatile memory cell transistors in association with bit lines and word lines. A multi-level cell scheme (MLC) is applied to each memory cell transistor to thereby make it possible for each memory cell transistor to store data of a plurality bits.

The sense amplifier module 12 outputs data DAT read from the memory cell array 11 to the controller 200 through the input and output circuit 14. The sense amplifier module 12 transfers write data DAT received from the controller 200 through the input and output circuit 14 to the memory cell array 11.

The sense amplifier module 12 includes a counter CT and a plurality of sense amplifier units (not illustrated) provided for each bit line. The counter CT counts the number of the OFF-cells of read data, that is, the number of memory cell transistors which are in an OFF state and transfers the count result to the sequencer 17. Details of the sense amplifier module 12 will be described later.

The row decoder 13 selects the word line corresponding to the memory cell transistor for which a read operation and a write operation are performed. The row decoder 13 applies a voltage needed for each of a selected word line and a non-selected word line.

The input and output circuit 14 transmits and receives, for example, an 8-bit input/output signal I/O (I/O0 to I/O7) to and from the controller 200 through data lines DQ0 to DQ7. For example, the input and output circuit 14 transfers write data DAT included in the input/output signal I/O received from the controller 200 to the sense amplifier module 12. The input and output circuit 14 transmits read data DAT transferred from the sense amplifier module 12 to the controller 200 as the input/output signal I/O.

The register 15 includes a status register 15A, an address register 15B, and a command register 15C. The status register 15A holds status information STS. The status register 15A transfers status information STS to the input and output circuit 14 in response to the instruction of the sequencer 17. The address register 15B receives an address ADD from the input and output circuit 14 and holds the address ADD. The address register 15B transfers a column address CA and a row address RA included in the address ADD to the sense amplifier module 12 and the row decoder 13, respectively. The command register 15C receives a command CMD from the input and output circuit 14 and holds the command CMD. The command register 15C transfers the command CMD to the sequencer 17.

The logic control circuit 16 receives the chip enable signal CEn, the command latch enable signal CLE, the address latch enable signal ALE, the write enable signal WEn, and the read enable signal REn from the controller 200 and controls the input and output circuit 14 and the sequencer 17 according to the control signals.

The sequencer 17 controls the entire operation of the NAND flash memory 100. Specifically, the sequencer 17 controls the sense amplifier module 12, the row decoder 13, the voltage generation circuit 19, or the like based on the command CMD transferred from the command register 15C and executes a data write operation, a data read operation, or the like. The sequencer 17 samples programming voltages at the time of the write operation to make it possible to calculate an offset value of the programming voltage based on the sampling results. The programming voltage is a voltage to be applied to a selected word line at the time of data write. Details of calculation of the offset value will be described later.

The sequencer 17 includes a register REG. The register REG includes, for example, a table associated with the offset value of the programming voltage (in the following, referred to as an "offset table"). The sequencer 17 refers to the offset table to set an optimum programming voltage. The offset table can be rewritten by, for example, a parameter write operation referred to as a set feature.

The ready/busy control circuit 18 generates the ready/busy signal R/Bn based on an operation state of the sequencer 17 and transmits the ready/busy signal to the controller 200. The ready/busy signal R/Bn is generated in such a way that the ready/busy control circuit 18 controls ON/OFF of the transistor Tr connected to an output of the ready/busy control circuit.

The voltage generation circuit 19 generates various voltages based on the instruction of the sequencer 17. The voltage generation circuit 19 supplies the generated voltage to the memory cell array 11, the sense amplifier module 12, the row decoder 13, and the like.

1.1.3 Configuration of Memory Cell Array

Next, a configuration of the memory cell array 11 will be described using FIG. 3. Although an example of FIG. 3 illustrates a configuration of the block BLK0, configurations of other blocks BLKs are the same.

Figure 3:
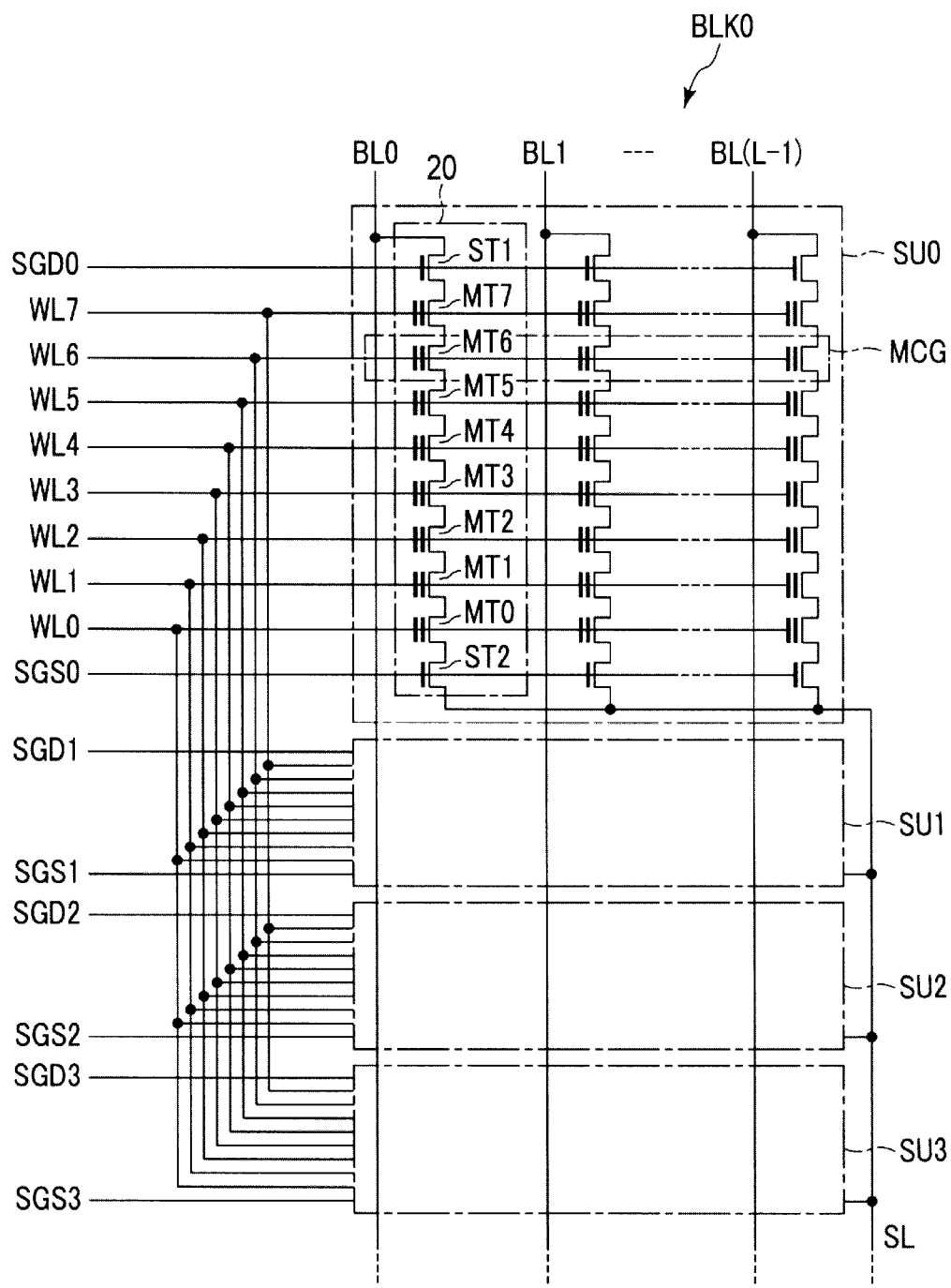
FIG. 3 is a circuit diagram of a memory cell array provided in the semiconductor memory device according to the first embodiment.

As illustrated in FIG. 3, the block BLK0 includes, for example, four string units SU (SU0 to SU3). The number of string units SU provided in a single block BLK is an arbitrary number. Each string unit SU includes a plurality of NAND strings 20. Each NAND string 20 includes, for example, eight memory cell transistors MT (MT0 to MT7) and selection transistors ST1 and ST2. In the following, in a case where the memory cell transistors MT0 to MT7 are not particularly specified, the memory cell transistors are denoted by the memory cell transistor MT. The memory cell transistor MT includes a control gate and a charge storage layer and holds data in a non-volatile manner.

The memory cell transistor MT may be a MONOS-type memory cell transistor in which an insulation film is used in the charge storage layer and may be a FG-type memory cell transistor in which a conductive layer is used in the charge storage layer. In the following, in the first embodiment, the MONOS-type memory cell transistor will be described by way of an example. The number of the memory cell transistors MT is not limited to eight memory cell transistors and may be 16 memory cell transistors, 32 memory cell transistors, 64 memory cell transistors, 128 memory cell transistors, or the like, and so the number of the memory cell transistors is not limited to any one particular number. The numbers of the selection transistors ST1 and ST2 are arbitrary numbers and may be one or more, respectively.

The memory cell transistors MT are connected in series between a source of the selection transistor ST1 and a drain of the selection transistor ST2. More specifically, current paths of the memory cell transistors MT0 to MT7 are connected in series. A drain of the memory cell transistor MT7 is connected to the source of the selection transistor ST1 and a source of the memory cell transistor MT0 is connected to the drain of the selection transistor ST2.

Gates of the selection transistors ST1 are respectively connected to select gate lines SGD0 to SGD3 in respective string unit SU0 to SU3. Similarly, gates of the selection transistors ST2 are respectively connected to select gate lines SGS0 to SGS3 in respective string unit SU0 to SU3. In the following, when the select gate lines SGD0 to SGD3 are not particularly specified, the select gate lines are denoted by the select gate line SGD. When the select gate lines SGS0 to SGS3 are not particularly specified, the select gate lines are denoted by the select gate line SGS. The select gate lines SGS0 to SGS3 of each string unit SU may be connected in common.

The control gates of the memory cell transistor MT0 to MT7 within the block BLK are respectively connected to the word lines WL0 to WL7 in common. In the following, in a case where the word lines WL0 to WL7 are not particularly specified, the word lines are denoted by the word line WL.

The drains of the selection transistors ST1 of respective NAND strings 20 within the string unit SU are respectively connected to different bit lined BL0 to BL (L−1) (L is an integer number of 2 or more). In the following, in a case where the bit lines BL0 to BL (L−1) are not particularly specified, the bit lines are denoted by the bit line BL. That is, a single NAND string 20 of each string unit SU is connected to the bit lines BL in common across the plurality of blocks BLK. Furthermore, sources of the plurality of selection transistors ST2 are connected to the source line SL in common. That is, the string unit SU is a set of the NAND strings 20 connected to different bit lines BL and connected the same select gate line SGD and the same select gate line SGS. The block BLK is a set of a plurality of string units SU between which the word line WL is shared. The memory cell array 11 is a set of a plurality of blocks BLK between which the bit line BL is shared.

The data write operation and data read operation are respectively collectively performed on the memory cell transistors MT connected to any of the word lines WL in any of the string units SU. In the following, a group of the memory cell transistors MT collectively selected when the data write operation or the data read operation is performed is referred to as a "memory cell group MCG". A collection of pieces of data of one bit to be written into or read from a single memory cell group MCG is referred to as a "page".

Data erase can be performed in units of blocks BLK or units smaller than the blocks BLK. An erase method is described in, for example, U.S. patent application Ser. No. 13/235,389 of which the title is "NONVOLATILE SEMICONDUCTOR MEMORY DEVICE" and which is filed Sep. 18, 2011. Also, it is described in, for example, U.S. patent application Ser. No. 12/694,690 of which the title is "NON-VOLATILE SEMICONDUCTOR STORAGE DEVICE" and which is filed Jan. 27, 2010. Further, it is described in, for example, U.S. patent application Ser. No. 13/483,610 of which the title is "NONVOLATILE SEMICONDUCTOR MEMORY DEVICE AND DATA ERASE METHOD THEREOF" and which is filed May 30, 2012. The entire contents of these patent applications are incorporated in the present specification by reference.

Furthermore, the configuration of the memory cell array 11 may have another configuration, such as the ones described in, for example, U.S. patent application Ser. No. 12/407,403 of which the title is "THREE DIMENSIONAL STACKED NON-VOLATILE SEMICONDUCTOR MEMORY" and which is filed Mar. 19, 2009, U.S. patent application Ser. No. 12/406,524 of which the title is "THREE DIMENSIONAL STACKED NON-VOLATILE SEMICONDUCTOR MEMORY" and which is filed Mar. 18, 2009, U.S. patent application Ser. No. 12/679,991 of which the title is "NON-VOLATILE SEMICONDUCTOR STORAGE DEVICE AND METHOD OF MANUFACTURING THE SAME" and which is filed Mar. 25, 2010, and U.S. patent application Ser. No. 12/532,030 of which the title is "SEMICONDUCTOR MEMORY AND METHOD FOR MANUFACTURING SAME" and which is filed Mar. 23, 2009. The entire contents of these patent applications are incorporated in the present specification by reference.

1.1.4 Configuration of Cross Section of Memory Cell Array

Figure 4:
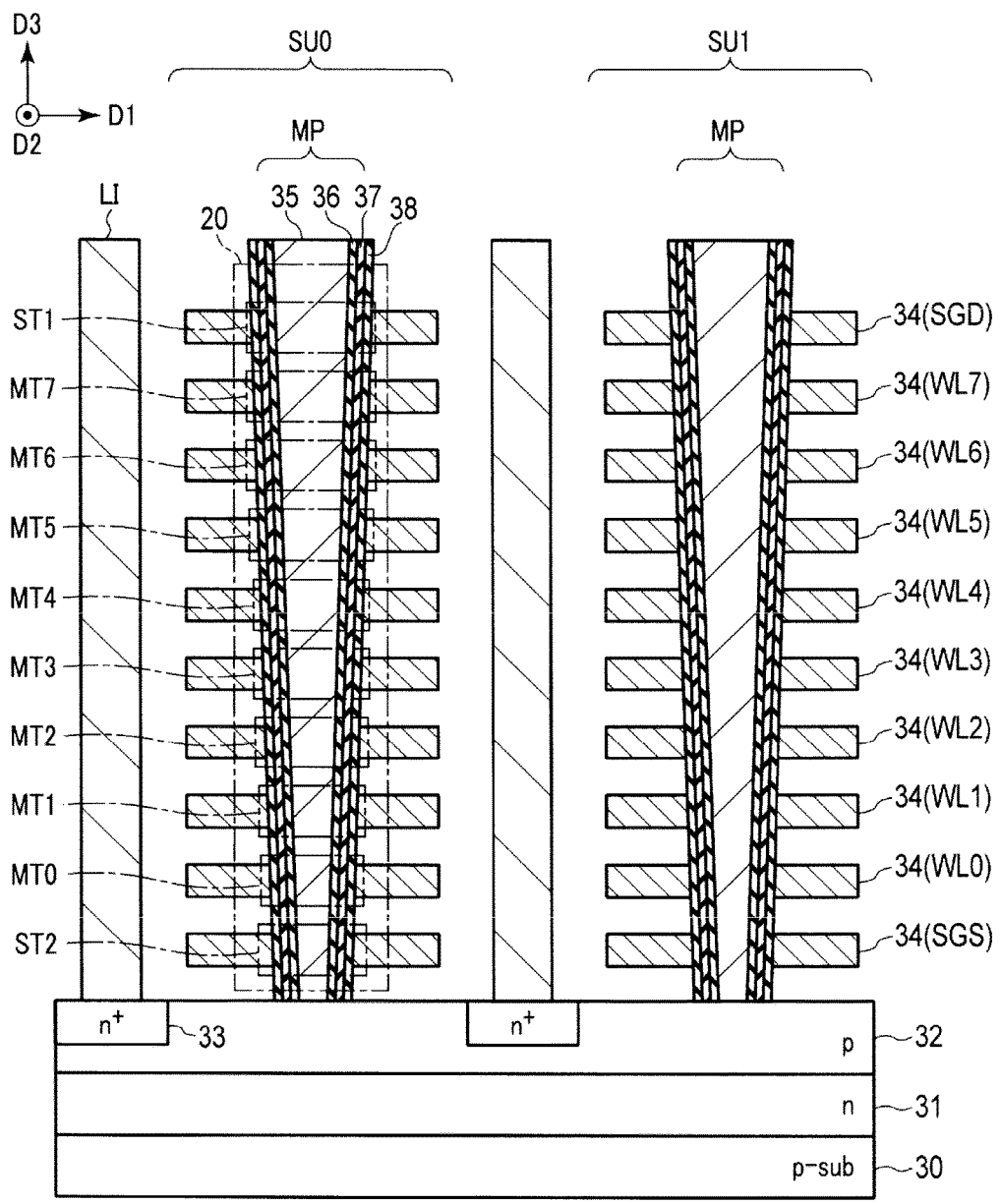
FIG. 4 is a cross-sectional view of the memory cell array provided in the semiconductor memory device according to the first embodiment.

Next, a configuration of a cross section of the memory cell array 11 will be described using FIG. 4. An example of FIG. 4 illustrates cross section of the string units SU0 and SU1 and configurations of cross sections of the string units SU2 and SU3 are also similar. In FIG. 4, an interlayer insulating film is omitted.

As illustrated in FIG. 4, a plurality of source line contacts LI extending in a second direction D2 perpendicular to the first direction D1 are provided parallel to the semiconductor substrate 30, along a first direction D1 parallel to the semiconductor substrate 30. A single string unit SU is disposed between two source line contacts LI. The source line contact LI is connected with a source line SL (not illustrated) provided above a semiconductor substrate 30 and the NAND string 20. The disposition of the source line contact LI and the NAND string 20 can be arbitrarily set. For example, a plurality of string units SU may be provided between two source line contacts LI. Furthermore, in the example of FIG. 4, in order to simplify description, although a case where a plurality of NAND strings 20 are arranged in a single row along the second direction D2 in a single string unit SU is illustrated, arrangement of the NAND strings 20 in a single string unit SU can be arbitrarily set. For example, two rows of the NAND strings 20 may be disposed or four rows of the NAND strings 20 may be arranged in the zigzag manner, along the second direction D2.

In each string unit SU, the NAND strings 20 are formed along a third direction D3 perpendicular to the semiconductor substrate 30. More specifically, an n-type well 31 is provided in a surface area of the semiconductor substrate 30. A p-type well 32 is provided in a surface area of the n-type well 31. An n-type diffusion layer 33 is provided in a portion of a surface area of the p-type well 32. Wiring layers 34 including ten layers functioning as the select gate line SGS, the word line WL, and the select gate line SGD are sequentially stacked through an interlayer insulating film (not illustrated) above the p-type well 32.

A semiconductor layer 35 which has a pillar shape and reaches the p-type well 32 by penetrating through the wiring layers 34 including ten layers is formed. A tunnel insulation film 36, a charge storage layer 37, and a block insulation film 38 are sequentially formed in this order on side surfaces of the semiconductor layer 35. For example, polycrystalline silicon is used in the semiconductor layer 35. For example, a silicon oxide film is used in the tunnel insulation film 36 and the block insulation film 38. For example, a silicon nitride film is used in the charge storage layer 37. In the following, a pillar formed by the semiconductor layer 35, the tunnel insulation film 36, the charge storage layer 37, and the block insulation film 38 is referred to as a "memory pillar MP". The semiconductor layer 35 functions as a current path of the NAND string 20 and becomes an area in which channels of respective transistors. An upper end of the semiconductor layer 35 is connected to the wiring layer (not illustrated) functioning as the bit line BL. The memory cell transistor MT and the selection transistors ST1 and ST2 are formed by the memory pillar MP and the wiring layer 34.

In the example of FIG. 4, a diameter of an upper surface of the memory pillar MP is larger than the diameter of a bottom surface in contact with the semiconductor substrate 30. The inclination angle of the side surfaces of the memory pillar MP is less than 90 degrees with respect to a plane of the semiconductor substrate 30 (hereinafter, such a shape is referred to as a "tapered shape"). In such a case, the cell sizes of the memory cell transistor MT (MT0 to MT7) differ for each wiring layer 34 depending on a shape of the memory pillar MP. More specifically, in the example of FIG. 4, the cell size of the memory cell transistor MT0 is the smallest and the cell size of the memory cell transistor MT7 is the largest.

When the cell sizes differ, the optimum value of the programming voltage to be applied to the selected word line WL may differ for example, at the time of the write operation.

The shape of the memory pillar MP is not limited to the tapered shape. For example, the memory pillar MP may have a columnar shape in which the diameter from the upper surface to the bottom surface is equal, and in which the diameter of the bottom surface of the memory pillar MP may be larger than the diameter of the upper surface thereof.

Furthermore, in the example of FIG. 4, although the wiring layers 34 functioning as the select gate lines SGD and SGS are respectively provided as a single layer, the plurality of wiring layers may be respectively provided to function as the select gate lines SGD and SGS.

The source line contact LI has a line shape along the second direction D2. For example, polycrystalline silicon is used in the source line contact LI. The bottom surface of the source line contact LI is connected to the n-type diffusion layer 33 and the upper surface is connected to the wiring layer (not illustrated) functioning as the source line SL.

1.1.5 Configuration of Sense Amplifier Module

Figure 5:
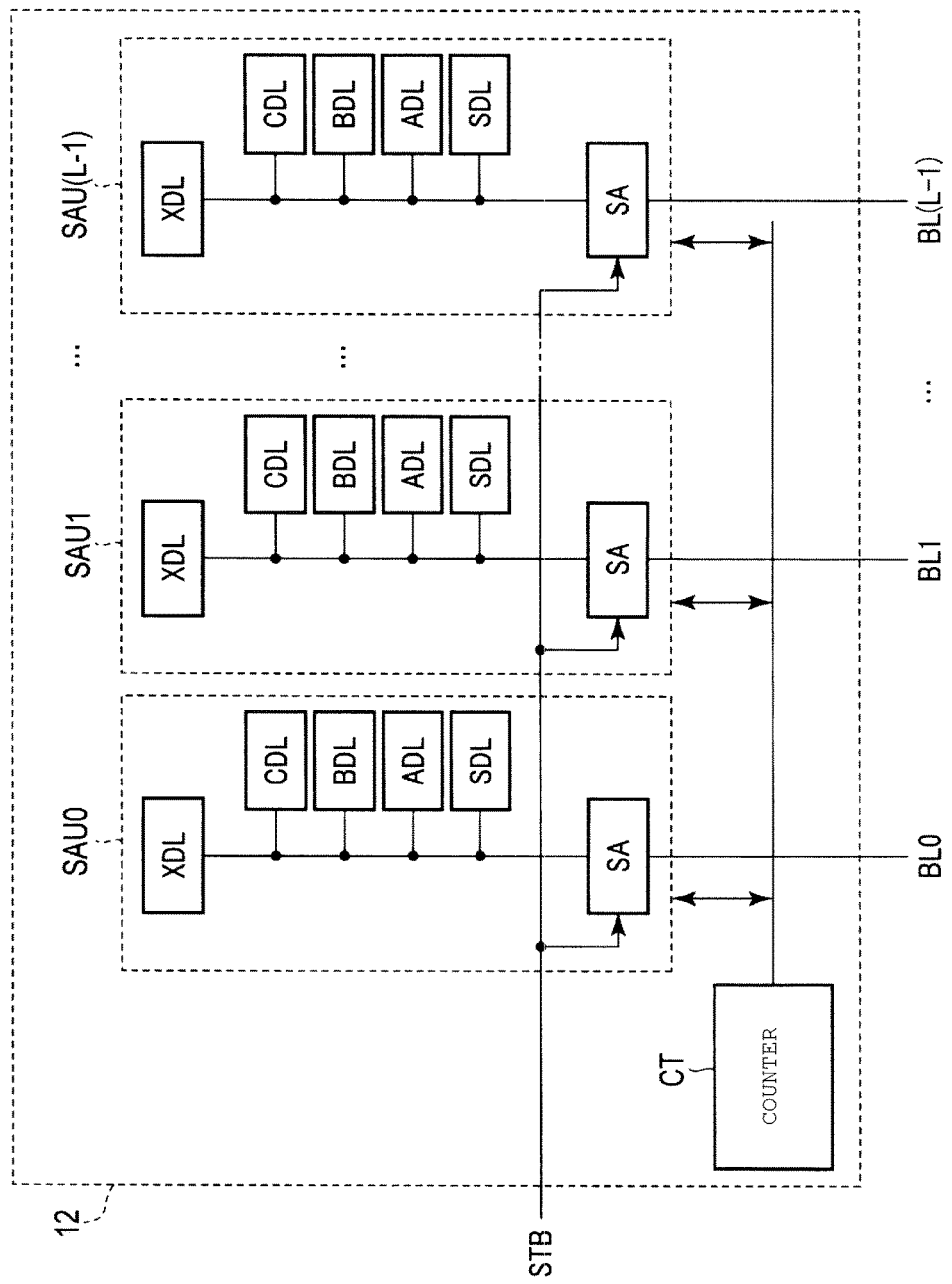
FIG. 5 is a block diagram of a sense amplifier module provided in the semiconductor memory device according to the first embodiment.

Next, a configuration of the sense amplifier module 12 will be described using FIG. 5. FIG. 5 is a circuit diagram of the sense amplifier module 12. As illustrated in FIG. 5, the sense amplifier module 12 includes the sense amplifier unit SAU (SAU0 to SAU (L−1)) provided for each bit line BL.

Each sense amplifier units SAU is connected to the counter CT so as to be able to transmit and receive data to and from the counter CT. Each sense amplifier unit SAU includes a sense circuit SA and latch circuits SDL, ADL, BDL, CDL, and XDL. The sense circuit SA and the latch circuits SDL, ADL, BDL, CDL, and XDL are connected so as to be able to transmit and receive data with each other.

The sense circuit SA senses a piece of data read into a corresponding bit line BL at the time of the read operation, reads the piece of data, and determines whether the piece of data is "0" and otherwise, "1". The sense circuit SA applies a voltage to the bit line BL based on a piece of data held in the latch circuit SDL at the time of the write operation.

The latch circuits SDL, ADL, BDL, and CDL temporarily hold read data and write data. The latch circuits ADL, BDL, and CDL are used for a multi-value operation for holding data of two bits or more in, for example, each memory cell transistor. The number of the latch circuits may be set to an arbitrary number and can be set according to, for example, the number of bits that are programmed in the memory cell transistor.

The latch circuit XDL is provided for each sense amplifier unit SAU and is used for input and output of data between the sense amplifier unit SAU and the controller 200. Data received from the controller 200 is transferred to the latch circuit SDL, ADL, BDL, or CDL through the latch circuit XDL. Data of the latch circuits SDL, ADL, BDL, and CDL is transferred to the controller 200 through the latch circuit XDL.

1.2 Distribution of Threshold Voltages of Memory Cell Transistor

Next, distribution of the threshold voltages for the memory cell transistor MT according to the first embodiment will be described using FIG. 6. In the following, although a case where the memory cell transistor MT holds data of a four-value (2 bits) will be described in the first embodiment, the memory cell transistor MT is not limited to holding data of a four-value. In the first embodiment, the memory cell transistor MT may hold, for example, data of an eight-value (3 bits), and may also hold data of a two-value (1 bit) or more.

Figure 6:
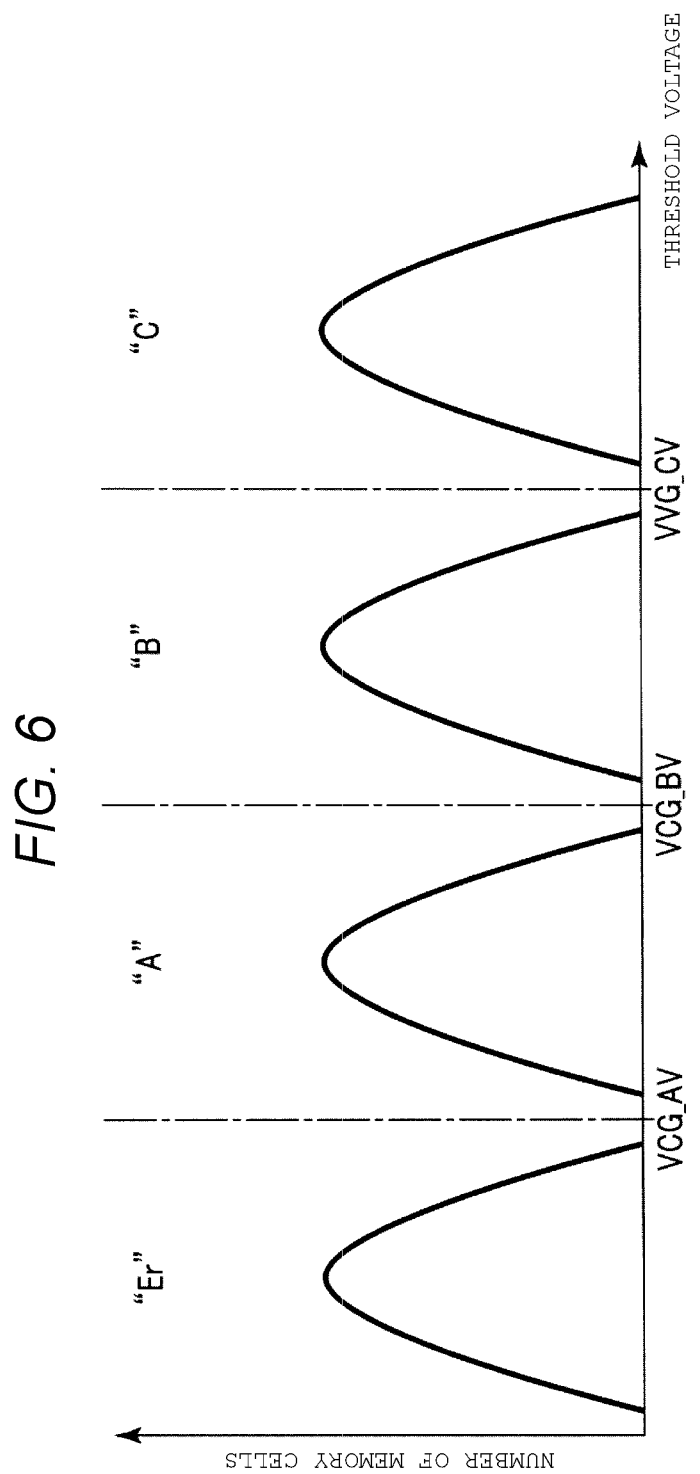
FIG. 6 is a graph of threshold value distributions of memory cell transistors provided in the semiconductor memory device according to the first embodiment.

As illustrated in FIG. 6, the threshold voltage of each memory cell transistor MT takes a discrete value, for example, a value included in any of four distributions. The four distributions are referred to as an "Er" level, an "A" level, a "B" level, and a "C" level, respectively, in an ascending order of the threshold voltage.

The "Er" level corresponds to, for example, a data erase state. The threshold voltage included in the "Er" level is smaller than a voltage VCG_AV and has a positive value or a negative value.

The "A" level, "B" level, and "C" level correspond to a state in which electric charges are injected into the charge storage layer and data is written and the threshold voltage included in respective distributions has, for example a positive value. The threshold voltage included in the "A" level is greater than or equal to a voltage VCG_AV and less than a voltage VCG_BV (but, VCG_BV>VCG_AV). The threshold voltage included in the "B" level is greater than or equal to the voltage VCG_BV and less than a voltage VCG_CV (but, VCG_CV>VCG_BV). The threshold voltage included in the "C" level is greater than or equal to the voltage VCG_CV and also less than voltages VREAD and VPASS (VREAD (or VPASS)>VCG_CV). The VREAD and VPASS are voltages to be respectively applied to a non-selected word line WL at the time of a data read operation and at the time of a data write operation.

As described above, each memory cell transistor MT has any of four distributions of the threshold voltages and thus, is able to take four kinds of states. These states are allocated to "00" to "11" in binary notation so as to make it possible for each memory cell transistor MT to hold data of 2-bit. In the following, two bits of 2-bit data are respectively referred to as an upper bit and a lower bit. In the memory cell group MCG, a set of the upper bits to be collectively written (or read) is referred to as an upper page and a set of the lower bits to be collectively written (or read) is referred to as a lower page.

Although, a case where four levels are discretely distributed is illustrated by way of an example in FIG. 6, the case is, for example, an ideal state immediately after data write. Accordingly, a situation where adjacent levels overlap each other may occur in practice. For example, after data write, the upper end of the "Er" level and the lower end of the "A" level may overlap due to disturbance or the like. In such a case, data is corrected by using, for example, the ECC technique.

1.3 Write Operation

Next, a write operation will be described. The write operation includes programming and programming verification. A combination of programming and programming verification (hereinafter, referred to as a "program loop") is repeated such that the threshold voltage of the memory cell transistor MT is increased to a target level.

Programming is an operation to increase the threshold voltage by injecting electrons into the charge storage layer (or operation to maintain the threshold voltage by inhibiting injection). In the following, the operation to raise the threshold voltage is referred to as a "'0' write". On the other hand, the operation to maintain the threshold voltage is referred to as a "'1' write" or "write inhibition".

Programming verification is an operation to read data after programming and determine whether the threshold voltage of the memory cell transistor MT reaches a target level or not. In the following, a case where the threshold voltage of the memory cell transistor MT reaches the target level is referred to as "verification passed" and a case where the threshold voltage of the memory cell transistor MT does not reach the target level is referred to as "verification failed".

In the first embodiment, there are two modes referred to as a "normal mode" and a "sampling mode" in the write operation. In a case where it is intended to perform optimization of the programming voltage to be applied to the word line WL, the sequencer 17 selects the sampling mode. In the following, an initial value of a programming voltage is denoted by VPGM and an optimized programming voltage is denoted by VPGM_SV.

The normal mode is a normal write sequence and the program loop is repeated to allow data to be written at the normal mode. In programming for a first time at the normal mode, a voltage VPGM_SV which is optimized at the sampling mode is used in the programming voltage and the programming voltage is stepped up each time when the program loop is repeated. In the following, a step-up voltage at the normal mode is denoted by DVP.

The sampling mode is a write sequence for obtaining an optimum programming voltage. In the following, a write operation during the sampling mode is simply referred to as "sampling". In the sampling mode, programming is executed using a voltage higher than the programming voltage to be applied first at the normal mode. In the following, the programming voltage to be applied to a selected word line WL in the program loop for a first time during the sampling mode is denoted by VSV. The voltages VSV, VPGM, and VPGM_SV have a relationship of VSV>VPGM_SV>VPGM. For example, the voltage VSV is a high voltage that causes a shift of the threshold voltage of the memory cell transistor MT from the "Er" level to the "B" level from in a single programming operation. The programming voltage is optimized, that is, an offset voltage VOS is determined based on the shift amount of the threshold voltage of the memory cell transistor MT of that case. The voltages VPGM, VPGM_SV, and VOS have a relationship of VPGM_SV=VPGM+VOS.

1.3.1 Sampling Mode

Next, the sampling mode will be described in detail using FIG. 7.

Figure 7:
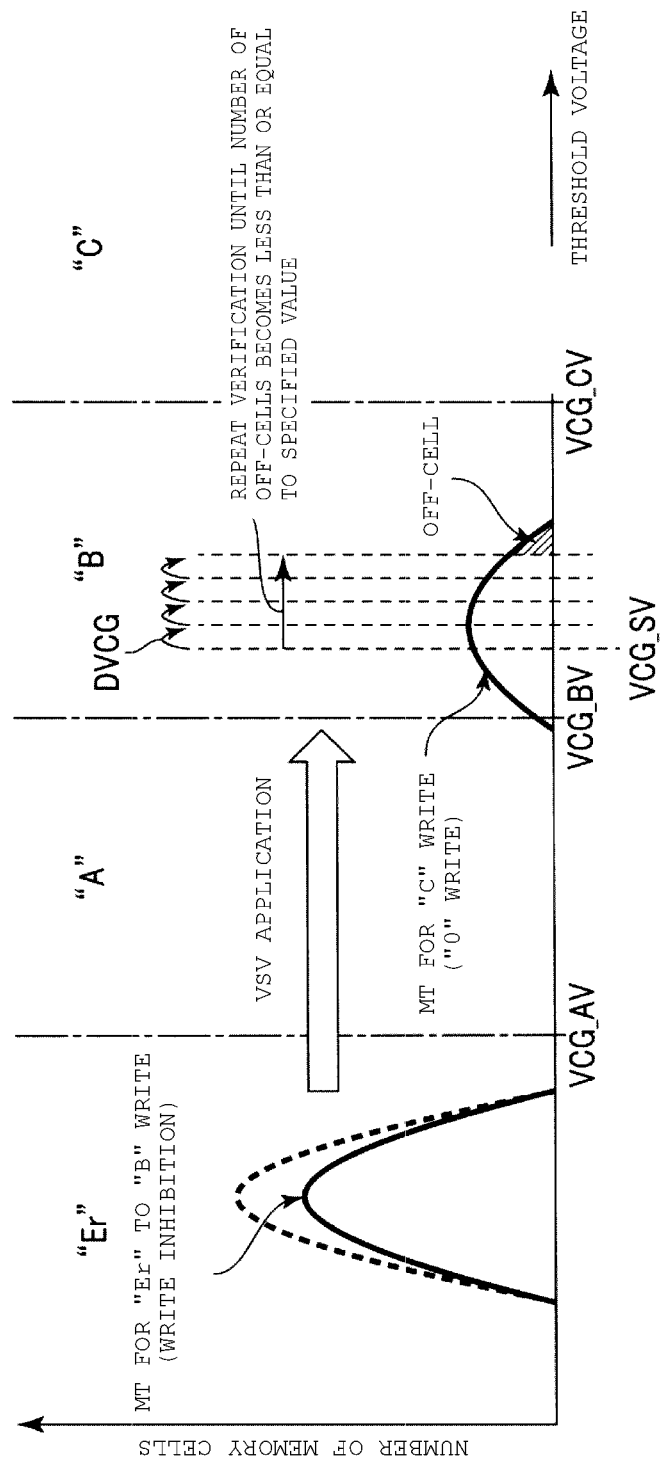
FIG. 7 is an explanatory diagram of a sampling mode in the semiconductor memory device according to the first embodiment.

As illustrated in FIG. 7, the sequencer 17 executes "0" write using the voltage VSV by targeting, for example, the memory cell transistor MT for which "C" level data is to be written (hereinafter, simply referred to as a "'C' write") during programming. For example, the number of the memory cell transistor MT for "C" write becomes about one-fourth of a data length by randomization processing. In this case, the memory cell transistors MT for which "Er" level data, the "A" level data, and the "B" level data are to be written (hereinafter, referred to as an "' Er' write", an "'A' write", and a "'B' write", respectively) becomes to a state of write inhibition. As a result, for example, the threshold voltages of many memory cell transistors MT for "C" write reach the "B" level from the "Er" level. The memory cell transistor MT targeted for "0" write may be a memory cell transistor MT for which data of a level (for example "C" level) higher than a level (for example, "B" level) that the threshold voltage reaches by "0" write using the voltage VSV.

The programming verification operations between the sampling mode and the normal mode are different from each other. More specifically, in a case of the sampling mode, the sequencer 17 counts the number of OFF-cells during programming verification and repeats programming verification while stepping up a read voltage at equal intervals of a voltage width until the number of OFF-cells becomes less than or equal to a specified number which is set in advance.

In the following, repetition of programming verification within the program loop is referred to as a "verification loop". In each verification loop, respective program verifications are respectively referred to as first verification to Mth verification (M is an integer of one or more) according to the number of times of the verification loops. Furthermore, the read voltage to be applied to the selected word line WL during first verification at the sampling mode is denoted by VCG_SV and a step-up voltage for the voltage VCG_SV is denoted by DVCG. More specifically, for example, the row decoder 13 applies a voltage (VCG_SV+DVCG) to the selected word line WL during second verification and applies a voltage (VCG_SV+2·DVCG) to the selected word line WL during third verification. Similarly, the row decoder 13 applies a voltage (VCG_SV+(M−1)·DVCG) to the selected word line WL during Mth verification.

When it is the sampling mode, in a case where the number of OFF-cells is less than or equal to the specified number, that is, in a case of write shortage, in first verification, the sequencer 17 repeats the program loop while stepping up the programming voltage until the number of OFF-cells becomes greater than the specified number. In the following, the step-up voltage for the voltage VSV at the sampling mode is denoted by DSV. In a case where the number of OFF-cells becomes greater than the specified number in first verification, the sequencer 17 repeats the verification loop until the number of OFF-cells becomes less than or equal to the specified number. In this case, the verification loop is repeated at least twice or more.

The sequencer 17 determines the offset voltage VOS based on the read voltage when the number of OFF-cells becomes less than or equal to the specified number, that is, the number of times of the verification loops. The sequencer 17 sets the optimum programming voltage VPGM_SV based on the offset voltage VOS. The voltage VPGM_SV and the voltage VOS have a relationship of VPGM_SV=VPGM+VOS.

The sequencer 17 may have a function of adjusting a voltage value and application period of the voltage VSV, the specified number of the OFF-cells, and the voltage values of the voltage DSV, the voltage VCG_SV, and the voltage DVCG_SV and the values and the application period may be changed using, for example, Set Feature by the controller 200.

1.3.2 Offset Table

Next, an offset table will be described using FIG. 8. In the first embodiment, the sequencer 17 includes an offset table relating to the read voltage (number of times of the verification loops) and the number of times of the program loops at the sampling mode. The sequencer 17 determines the offset voltage VOS based on the offset table. In an example of FIG. 8, the number of times of the program loops is set to twice to the maximum and the number of times of the verification loops is set to the fifth times to the maximum, but is not limited thereto. In the sampling mode, the number of times of the program loops and the number of times of programming verification can be set to an arbitrary number.

As illustrated in FIG. 8, for example, in a case where the number of times of the program loops is once and the number of times of the verification loops is twice, a voltage VOS1_2 is set as the offset voltage VOS. Similarly, in a case where the numbers of times of the verification loops are respectively three times, four times, and five time, voltages VOS1_3, VOS1_4, and VOS1_5 are respectively set as the offset voltage VOS. Similarly, in a case where the number of times of the program loops is twice, the voltages VOS2_2 to VOS2_5 are set according to the number of times of verification loops. In a case where the numbers of times of the program loops are equal, the greater the number of times of verification loops, the smaller the offset voltage VOS is.

For example, the voltages VOS1_2 to VOS1_5 have a relationship of VOS1_2>VOS1_3>VOS1_4>VOS1_5. In a case where the numbers of times of the verification loops are equal, the greater the number of times of program loops, the larger the offset voltage VOS is. For example, the voltages VOS1_2 and the voltage VOS_2_2 have a relationship of VOS1_2<VOS2_2. Step up widths between respective voltages in the voltages VOS1_2 to VOS1_5 and the voltages VOS2_2 to VOS2_5 may be equal or may differ.

1.3.3 Entire Flow of Write Operation in Semiconductor Memory Device

Figure 9:
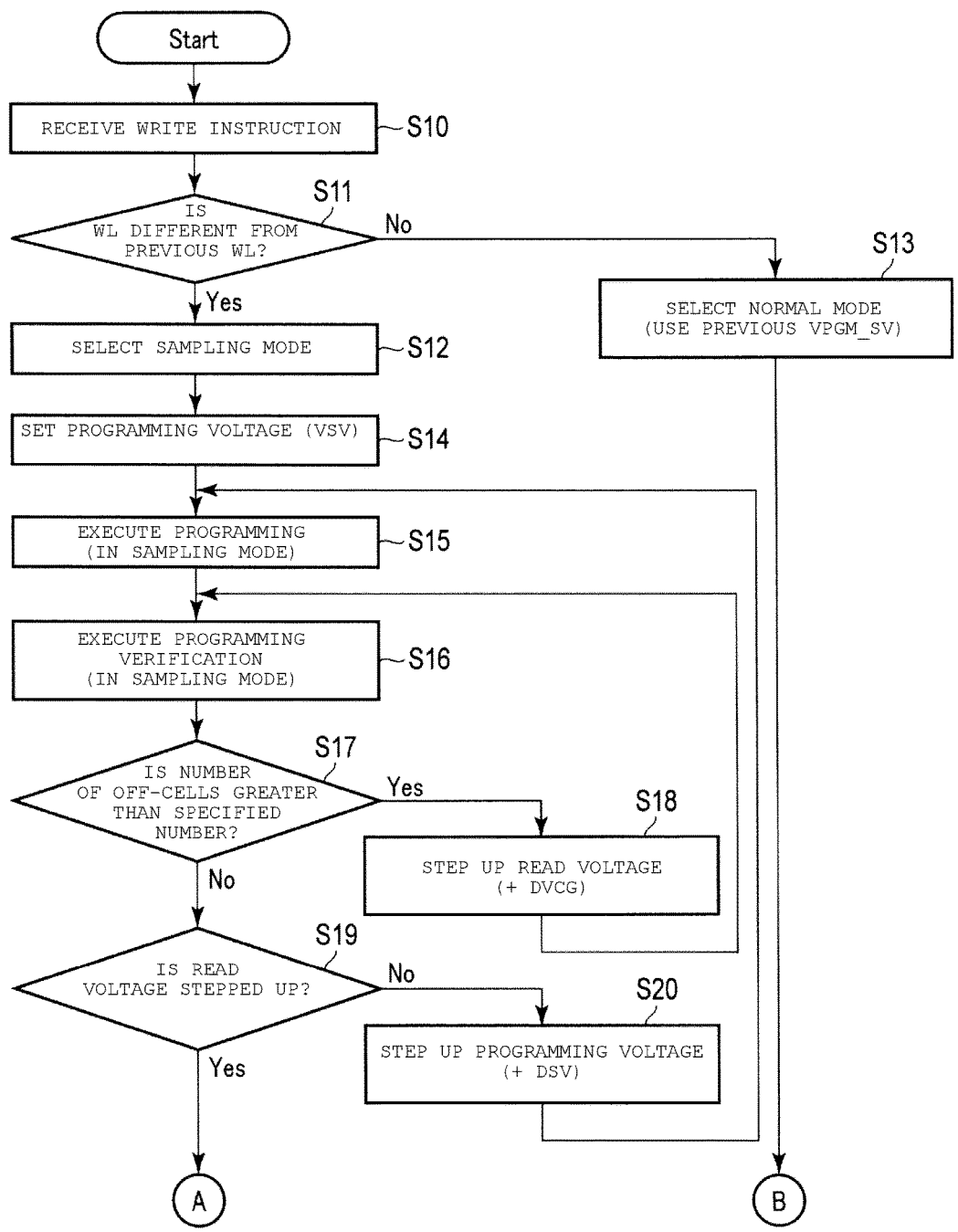
FIG. 9 is a flowchart illustrating a write operation in the semiconductor memory device according to the first embodiment.
Figure 10:
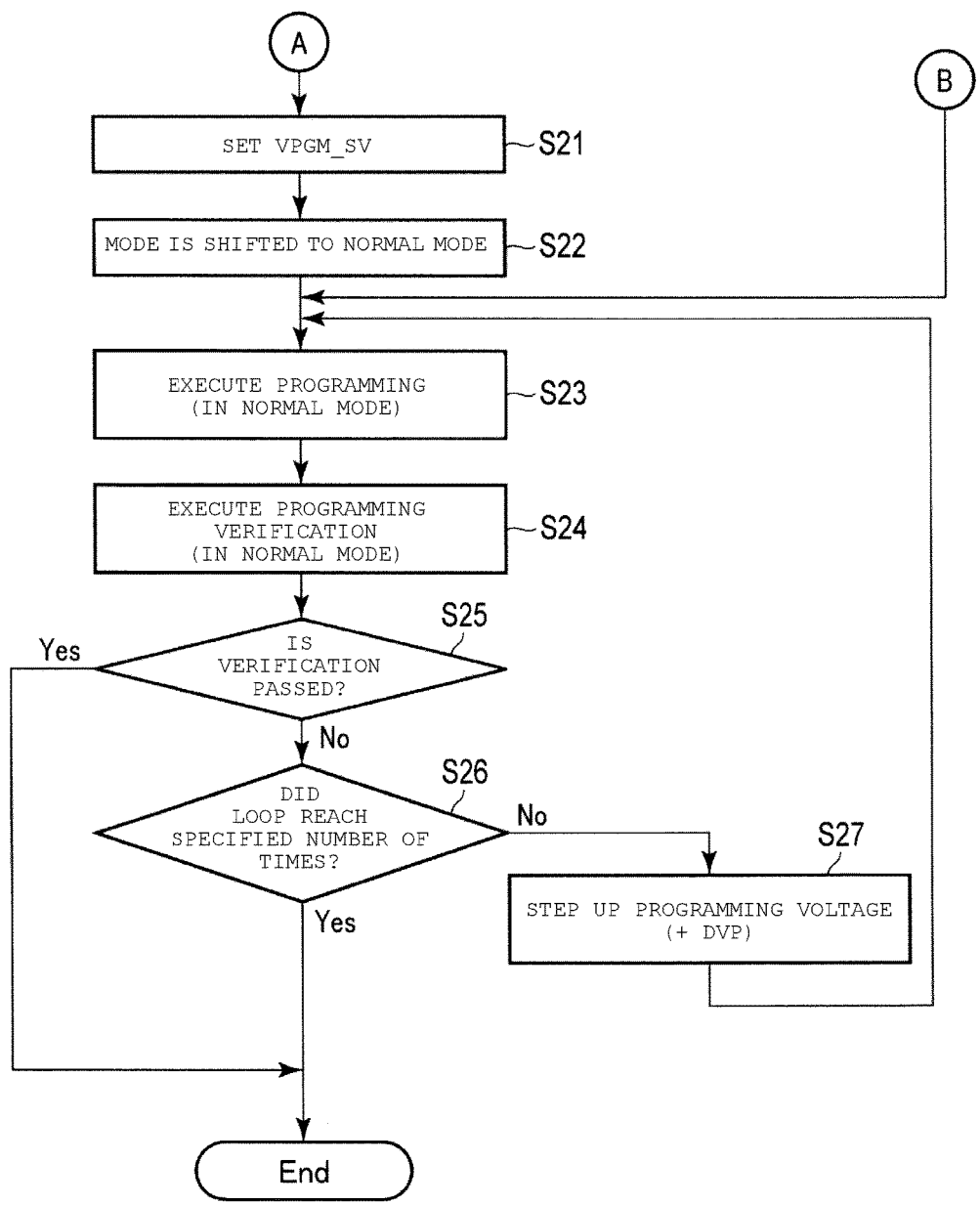
FIG. 10 is another flowchart illustrating the write operation in the semiconductor memory device according to the first embodiment.

Next, the entire flow of the write operation in the semiconductor memory device will be described using FIG. 9 and FIG. 10. In the examples of FIG. 9 and FIG. 10, a case where the normal mode is selected in a case where the same word line WL of the same block BLK as that in the previous write operation and a sampling mode is selected in a case where a different word line WL from that in previous write operation is selected is illustrated. A condition for selecting the sampling mode can be arbitrarily set. For example, the sequencer 17 may apply the sampling mode each time, set the programming voltage VPGM_SV, and then, execute write according to the normal mode. In addition, the sequencer 17 may select the sampling mode according to a command transmitted from the controller 200.

As illustrated in FIG. 9, first, the NAND flash memory 100 receives a write instruction (which includes command CMD, address ADD, and data DAT) from the controller 200 (Step S10). More specifically, the input and output circuit 14 of the NAND flash memory 100 transfers the receive command CMD, the address ADD, and data DAT to the command register 15C, the address register 15B, and the sense amplifier module 12, respectively. The address register 15B transmits the column address CA to the sense amplifier module 12 and transmits the row address RA to the row decoder 13. When the command CMD is stored in the command register 15C, the ready/busy control circuit 18 shifts a ready/busy signal from "H" level to "L" level according to control of the sequencer 17.

In a case where the selected word line WL is different from the previous word line WL (Step S11_Yes), the sequencer 17 selects the sampling mode (Step S12). More specifically, for example, in a case where the selected block BLK is different from the previous block BLK or in a case where the selected block BLK is the same as the previous block BLK but the selected word line WL is different from the previous word line WL, the sequencer 17 selects the sampling mode.

On the other hand, in a case where the selected word line WL is the same as the previous word line WL (Step S11_No), the sequencer 17 selects the normal mode (Step S13). For example, in a case where the string unit SU is different from the previous string unit SU but the selected word line WL is the same as the previous word line WL or a case where the memory cell group MCG is the same as the previous memory cell group, the sequencer 17 selects the normal mode. In a case where the normal mode is selected, the sequencer 17 sets the programming voltage VPGM_SV which was used in the previous write operation as the programming voltage to be used first. The programming voltage VPGM_SV which was used in the previous write operation is held in, for example, the register REG within the sequencer 17.

In a case where the sampling mode is selected (Step S12), the sequencer 17 sets the voltage VSV as the programming voltage (Step S14).

The sequencer 17 executes programming using the voltage VSV (Step S15). More specifically, the sequencer 17 regards the memory cell transistor MT for "C" write as a target for "0" write and causes the memory cell transistor MT for "Er" write, "A" write, and "B" write to become a state of write inhibition. The sense amplifier module 12 applies, for example, a voltage VSS to the bit line BL corresponding to the memory cell transistor MT for "C" write and applies a voltage VBL (>VSS) to the bit line BL corresponding to the memory cell transistors MT for "Er" write, "A" write, and "B" write. The row decoder 13 applies the voltage VSV to the selected word line WL and applies the voltage VPASS to the non-selected word line WL in the selected block BLK. The voltage VPASS is a voltage allowing the memory cell transistor MT to be in an ON state regardless of the threshold voltage of the memory cell transistor MT. The voltage VPASS has a relationship of VPASS<VPGM<VSV. With this, the threshold voltage of the memory cell transistor MT for "C" write is increased.

Next, the sequencer 17 executes programming verification (Step S16). More specifically, the row decoder 13 applies a read voltage of first verification VCG_SV to the selected word line WL and applies the voltage VREAD to the non-selected word line WL. The voltage VREAD is a voltage allowing the memory cell transistor MT to be in an ON state regardless of held data and has a relationship of VREAD (>VCG_CV)>VCG_SV. For example, in a case where the threshold voltage of the memory cell transistor MT targeted for reading is higher than the voltage VCG_SV, the memory cell transistor MT becomes an OFF state and in a case where the threshold voltage is lower than the voltage VCG_SV, the memory cell transistor MT becomes the ON state. In this state, the sense amplifier module 12 senses a current flowing to each bit line BL and reads data in the memory cell transistor MT, and the counter CT counts the number of OFF-cells.

In a case where the number of OFF-cells is greater than the specified number (Step S17_Yes), the sequencer 17 steps up the read voltage by a voltage DVCG. More specifically, for example, the sequencer 17 sets a voltage (VCG_SV+DVCG) as a read voltage in second verification. The sequencer 17 returns to Step S16 and repeats the verification loop until the number of OFF-cells becomes less than or equal to the specified number.

In a case where the number of OFF-cells is less than or equal to the specified number (Step S17_No), the sequencer 17 confirms whether the read voltage is stepped up. That is, the sequencer 17 confirms whether the number of OFF-cells is less than or equal to the specified number, in a verification loop for a first time.

In a case where the read voltage is not stepped up (Step S19_No), the sequencer 17 steps up the programming voltage by the voltage DSV (Step S20). More specifically, for example, the sequencer 17 sets a voltage (VSV+DSV) as a programming voltage to be used second. The sequencer 17 returns to Step S15 and executes programming again. The sequencer 17 repeats the program loop at the sampling mode until it comes to a situation where the verification loop is repeated at least twice.

As illustrated in FIG. 10, in a case where the read voltage is stepped up (Step S19_Yes), that is, in a case where the verification loop is repeated at least twice, the sequencer 17 determines that sampling was normally executed and sets the programming voltage VPGM_SV based on the number of times (read voltage) of the verification loops and the number of times of the program loops (Step S21).

Next, the sequencer 17 is shifted to the normal mode and continues the write operation (Step S22).

After being shifted to the normal mode in Step S22 or after selecting the normal mode in Step S13, the sequencer 17 executes programming at the normal mode (Step S23). More specifically, the sequencer 17 regards the memory cell transistors MT for "A" write, "B" write, and "C" write as a target for "0" write and causes the memory cell transistor MT for "Er" write to become a state of write inhibition. The sense amplifier module 12 applies, for example, the voltage VSS to the bit line BL corresponding to the memory cell transistors MT for "A" write, "B" write, and "C" write and applies the voltage VBL (>VSS) to the bit line BL corresponding to the memory cell transistor MT for "Er" write. The row decoder 13 applies the voltage VPGM_SV to the selected word line WL as the programming voltage to be used first at the normal mode.

Next, the sequencer 17 executes programming verification (Step S24). More specifically, for example, in a case where programming verification of "A" level is performed, the row decoder 13 applies the voltage VCG_AV to the selected word line. In programming verification at the normal mode, programming verification of a plurality of levels may be executed. In this case, the voltage width intervals of the read voltage according to respective levels may be equal to each other. For example, in a case where verification of "A" level, "B" level, and "C" level are executed, a voltage difference between the voltage VCG_AV and the voltage VCG_BV and a voltage difference between the voltage VCG_BV and the voltage VCG_CV may not be equal to each other.

In a case where verification is passed (Step S25_Yes), the sequencer 17 ends the write operation.

In a case where verification is failed (Step S25_No), the sequencer 17 confirms whether the number of times of the program loops reaches the specified number of times which is set in advance at the normal mode (Step S26).

In a case where the number of times of the program loops reaches the specified number (Step S26_Yes), the sequencer 17 ends the write operation and reports to the controller 200 that the write operation is not ended normally (by setting the status information STS).

In a case where the program loop does not reach the specified number of times (Step S26_No), the sequencer 17 steps up the programming voltage in the program loop by the voltage DVP (Step S27). More specifically, for example, the sequencer 17 sets the voltage (VPGM_SV+DVP) as a programming voltage to be used second at the normal mode. The sequencer 17 returns to Step S23 and executes programming again.

Until verification is passed or until the number of times of the program loops reaches the specified number of times at the normal mode, the sequencer 17 repeats the program loop.

1.3.4 Specific Example of Voltages of Selected Word Line at the Time of the Write Operation Next, a specific example of voltages of the selected word line WL at the time of the write operation will be described using FIG. 11 and FIG. 12. An example of FIG. 11 illustrates a case where the sequencer is shifted to the normal mode after the program loop is executed once at the sampling mode and an example of FIG. 12 illustrates a case where the sequencer is shifted to the normal mode after the program loop is executed twice at the sampling mode.

First, a case where the program loop is executed once at the sampling mode will be described.

Figure 11:
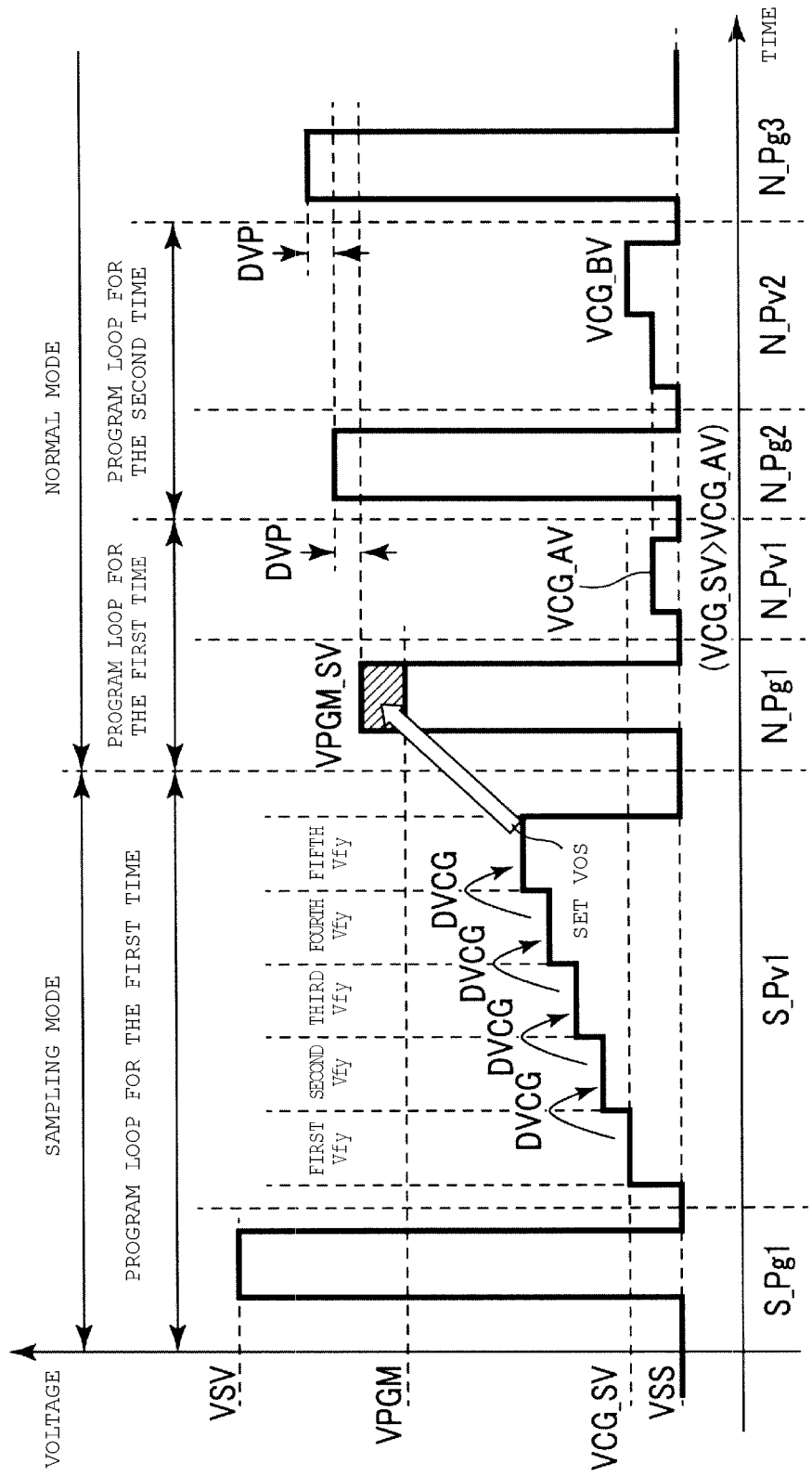
FIG. 11 is a timing chart illustrating voltages of a selected word line at the time of the write operation in the semiconductor memory device according to the first embodiment.
Figure 12:
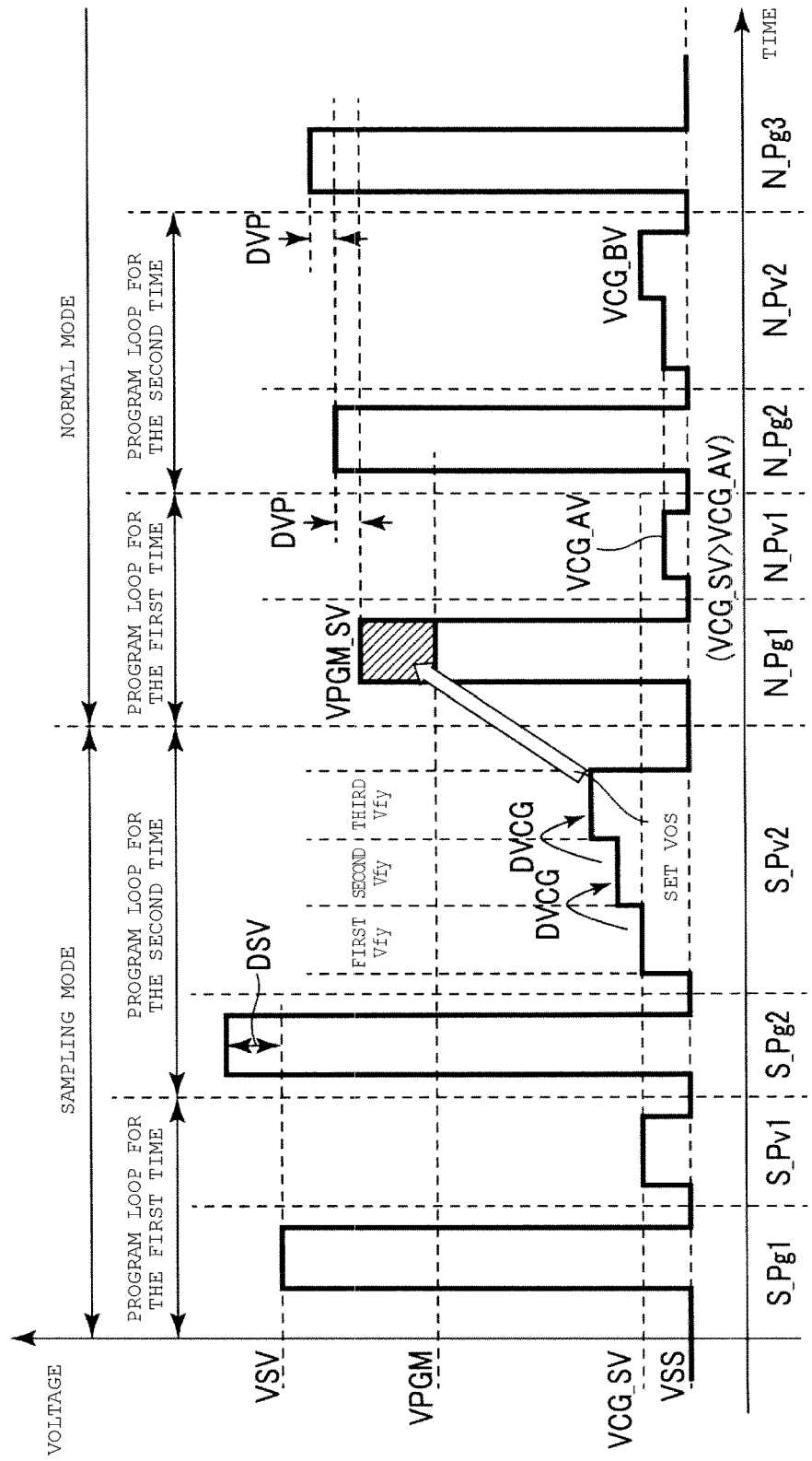
FIG. 12 is another timing chart illustrating voltages of the selected word line at the time of the write operation in the semiconductor memory device according to the first embodiment.

As illustrated in FIG. 11, first, the sequencer 17 selects the sampling mode. The sequencer 17 executes programming for a first time according to the sampling mode in a program loop for a first time at the sampling mode ("S_Pg1") In this case, the row decoder 13 applies the voltage VSV to the selected word line WL.

Next, the sequencer 17 executes programming verification for a first time according to the sampling mode ("S_Pv1"). In the example of FIG. 11, a case where the verification loop is repeated five times is illustrated. The row decoder 13 applies the voltage VCG_SV to the selected word line WL in first verification ("first Vfy"). The row decoder 13 steps up the voltage to be applied to the selected word line WL by the voltage DVCG each time when the verification loop is repeated. More specifically, the row decoder 13 applies a voltage (VCG_SV+DVCG) to the selected word line WL in second verification ("the second Vfy") and applies the voltage (VCG_SV+2·DVCG) to the selected word line WL in third verification ("the third Vfy"). Furthermore, the row decoder 13 applies a voltage (VCG_SV+3·DVCG) to the selected word line WL in fourth verification ("fourth Vfy") and applies a voltage (VCG_SV+4·DVCG) to the selected word line WL in fifth verification ("fifth Vfy").

The sequencer 17 determines the offset voltage VOS based on the sampling result and calculates a corrected programming voltage VPGM_SV. In a case where the normal mode is selected, the sequencer 17 omits operations described up to now for the sampling mode.

Next, the sequencer 17 is shifted to the normal mode. The sequencer 17 executes programming for a first time according to the normal mode in the program loop for a first time at the normal mode ("N_Pg1"). In this case, the row decoder 13 applies the voltage VPGM_SV to the selected word line WL.

Next, the sequencer 17 executes programming verification for a first time according to the normal mode ("N_Pv1"). In the example of FIG. 11, a case where programming verification of "A" level is executed is illustrated. The row decoder 13 applies the voltage VCG_AV which is lower than the voltage VCG_SV and corresponds to programming verification of "A" level at the sampling mode to the selected word line WL.

Next, the sequencer 17 executes programming for a second time according to the normal mode in a program loop for a second time at the normal mode ("N_Pg2"). In this case, the row decoder 13 applies the voltage (VPGM_SV+DVP) obtained by stepping up the voltage VPGM_SV by the voltage DVP to the selected word line WL.

Next, the sequencer 17 executes verification for a second time according to the normal mode ("N_Pv2"). In the example of FIG. 11, a case where programming verification of "A" level and "B" level are executed is illustrated. The row decoder 13 applies the voltage VCG_BV corresponding to programming verification of "B" level to the selected word line WL after applying the voltage VCG_AV corresponding to programming verification of "A" level to the selected word line WL.

Next, the sequencer 17 executes a third program according to the normal mode in a third program loop at the normal mode ("N_Pg3"). In this case, the row decoder 13 applies the voltage (VPGM_SV+2·DVP) obtained by stepping up the voltage (VPGM_SV+DVP) by the voltage DVP to the selected word line WL.

When verification is passed or until the number of times of the program loops reaches the specified number of times, the sequencer 17 repeats the program loop at the normal mode.

Next, a case where programming is executed twice at the sampling mode will be described.

As illustrated in FIG. 12, first, the sequencer 17 selects the sampling mode. The sequencer 17 executes programming to be first according to the sampling mode in a program loop for a first time at the sampling mode ("S_Pg1"). In this case, the row decoder 13 applies the voltage VSV to the selected word line WL.

Next, the sequencer 17 executes programming verification for a first time according to the sampling mode ("S_Pv1"). In the example of FIG. 12, a counted number of the OFF-cells is less than or equal to the specified number and thus, the sequencer 17 ends programming verification after executing once.

Next, the sequencer 17 executes programming for a second time according to the sampling mode in a program loop for a second time at the sampling mode ("S_Pg2"). In this case, the row decoder 13 applies the voltage VSV (VSV+DSV) obtained by stepping up the voltage VSV by the voltage DSV to the selected word line WL.

Next, the sequencer 17 executes programming verification for a second time according to the sampling mode ("S_Pv2"). In the example of FIG. 12, a case where the verification loop is repeated three times is illustrated. The row decoder 13 applies the voltage VCG_SV to the selected word line WL in first verification ("first Vfy"). The row decoder 13 steps up a voltage to be applied to the selected word line WL by the voltage DVCG each time when the verification loop is repeated. More specifically, the row decoder 13 applies the voltage (VCG_SV+DVCG) to the selected word line WL in second verification ("second Vfy") and applies the voltage (VCG_SV+2·DVCG) to the selected word line WL in third verification ("third Vfy").

The sequencer 17 determines the offset voltage VOS based on the sampling result and calculates the corrected programming voltage VPGM_SV.

Next, the sequencer 17 is shifted to the normal mode. The write operation at the normal mode is the same as FIG. 11 and thus, description thereof will be omitted.

1.4 Effect According to First Embodiment

According to the configuration of the first embodiment, it is possible to enhance processing capability of the semiconductor memory device and the memory system. In the following, the effect of the first embodiment will be described in detail.

For example, in the three-dimensional stacked NAND flash memory, the cell sizes of the memory cell transistors MT within the NAND string may differ. In such a case, the optimum programming voltage is different for each memory cell transistor MT, that is, for each word line WL.

As a method for optimizing the programming voltage, for example, there is a method in which data is written into another memory cell group MCG, a programming voltage when a threshold voltage of the memory cell transistor MT reaches a target level (for example "A" level) is obtained, and the programming voltage is applied. However, in this case, the program loop (programming and verification) is repeated until the programming voltage reaches a target level and thus, it takes time for optimization. It is unable to optimize the programming voltage for the memory cell transistor MT to which writing is actually made.

In contrast, in the configuration of the first embodiment, the semiconductor memory device has two write modes of a sampling mode and a normal mode. In a case where the sampling mode is selected, the semiconductor memory device can apply a programming voltage higher than the programming voltage used for programming for a first time at the normal mode to the selected word line WL. Furthermore, the semiconductor memory device can repeat programming verification while stepping up the read voltage at equal intervals of a voltage width within the program loop until the number of OFF-cells becomes less than or equal to the specified number which is set in advance. The semiconductor memory device can optimize the programming voltage based on the programming voltage and the number of times programming verification is repeated at the sampling mode. Accordingly, the semiconductor memory device can reduce the number of times of programming is required for reaching the optimum value of the programming voltage in comparison with a method in which an optimum value of the programming voltage is reached while repeating programming and programming verification. With this, the semiconductor memory device can reduce time required for optimization of the programming voltage. Accordingly, it is possible to enhance processing capability of the semiconductor memory device and the memory system.

Furthermore, in the configuration of the first embodiment, an optimized programming voltage is used at the normal mode to thereby make it possible to reduce the number of times the program loops is performed until the threshold voltage of the memory cell transistor MT reaches a required level. Accordingly, it is possible to reduce processing time of the write operation.

Furthermore, in the configuration of the first embodiment, programming ("0" write) is executed by targeting the memory cell transistor MT for which data having a level, which is higher than the level that the threshold voltage of the memory cell transistor MT reaches by sampling, is to be written. Accordingly, it is possible to execute the write operation of the normal mode using the optimized programming voltage after the sampling mode is ended.

Furthermore, in the configuration of the first embodiment, it is possible to hold a voltage value (voltage value of voltage VPGM_SV) of the optimized programming voltage in, for example, in the register REG within the sequencer 17.

Accordingly, in a case where the held voltage value of the programming voltage can be used, the sampling mode can be omitted and thus, it is possible to prevent the increase in processing time.

The register REG may hold two or more voltage values of the voltage VPGM_SV calculated at the sampling mode. Otherwise, a plurality of registers REG may be provided in order to hold the voltage value of the voltage VPGM_SV for each sampling mode. For example, the sequencer 17 executes the sampling mode for each word line WL to make it possible to hold the voltage value of the voltage VPGM_SV corresponding to each word line WL in a single register REG or the plurality of registers REG. In this case, as the voltage value of the voltage VPGM_SV used at the normal mode, the voltage value of the voltage VPGM_SV held in the register REG associated with the sampling mode is used.

2. Second Embodiment

Next, a semiconductor memory device and a memory system according to a second embodiment will be described.

In the second embodiment, four examples of a case where the sequencer 17 selects a sampling mode in the write operation are described. In the following, only the matters different from the first embodiment will be described.

2.1 First Example

Figure 13:
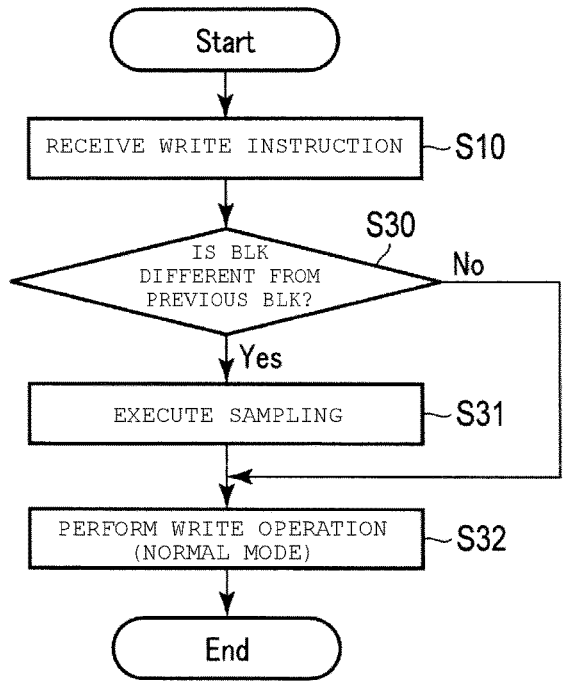
FIG. 13 is a flowchart illustrating a write operation in a semiconductor memory device according to a first example of a second embodiment.

First, a first example will be described using FIG. 13. In the first example, in a case where a block BLK different from the previous block BLK is selected, the sampling mode is selected. FIG. 13 is a flowchart in which the entire flow of the write operation in the NAND flash memory 100 is illustrated to be simpler than that in FIG. 9 and FIG. 10 of the first embodiment.

As illustrated in FIG. 13, first, the NAND flash memory 100 receives a write instruction from the controller 200 (Step S10).

In a case where the selected block BLK is different from the previous block BLK (Step S30_Yes), the sequencer 17 selects a sampling mode and executes sampling (Step S31). Details of the sampling operation are the same as Steps S12 and S14 to S22 of FIG. 9 and FIG. 10 of the first embodiment. For example, in a case where variation of the optimum value of the programming voltage is large between the blocks BLK, the sequencer 17 executes sampling for each block BLK. As the result of sampling, the sequencer 17 sets the programming voltage VPGM_SV.

In a case where the selected block BLK is identical with the previous block BLK (Step S30_No), the sequencer 17 uses the programming voltage VPGM_SV held within the register REG.

Next, the sequencer 17 selects the normal mode and perform write (Step S32). In this case, the write operation is the same as Steps S23 to S27 in FIG. 9 and FIG. 10 of the first embodiment.

2.2 Second Example

Next, a second example will be described using FIG. 14. In a second example, in a case where a string unit SU0 is selected, the sampling mode is selected. In the following, only the matters different from the first example will be described.

Figure 14:
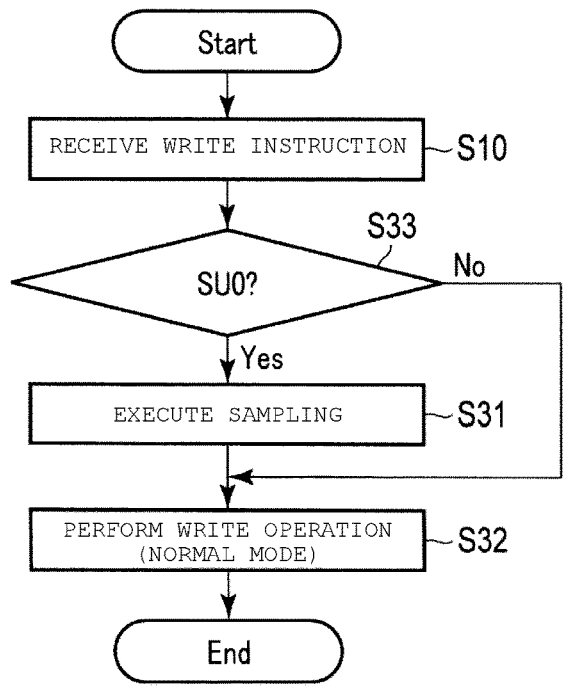
FIG. 14 is a flowchart illustrating a write operation in a semiconductor memory device according to a second example of the second embodiment.

As illustrated in FIG. 14, unlike in the first example, in a case where the string unit SU0 is selected (Step S33_Yes), the sequencer 17 executes sampling (Step S31). For example, in the second example, a writing order in the selected block BLK becomes in order of string units SU0 to SU3 of word line WL0, string units SU0 to SU3 of word line WL1, . . . , string units SU0 to SU3 of word line WL7. For that reason, in a case where the string unit SU0 is selected for a certain word line WL (Step S33_Yes), sampling is executed and in a case where the string units SU1 to SU3 are selected for a certain word line WL (Step S33_No), the programming voltage VPGM_SV, which is optimized when the string unit SU0 is selected, is used. In the second example, in a case where the string unit SU0 of the block BLK0 is selected, the sampling mode may be selected.

2.3 Third Example

Next, a third example will be described using FIG. 15. In a third example, in a case where a memory cell group MCG different from the previous memory cell group MCG is selected, the sampling mode is selected. In the following, only the matters different from the first and second examples will be described.

Figure 15:
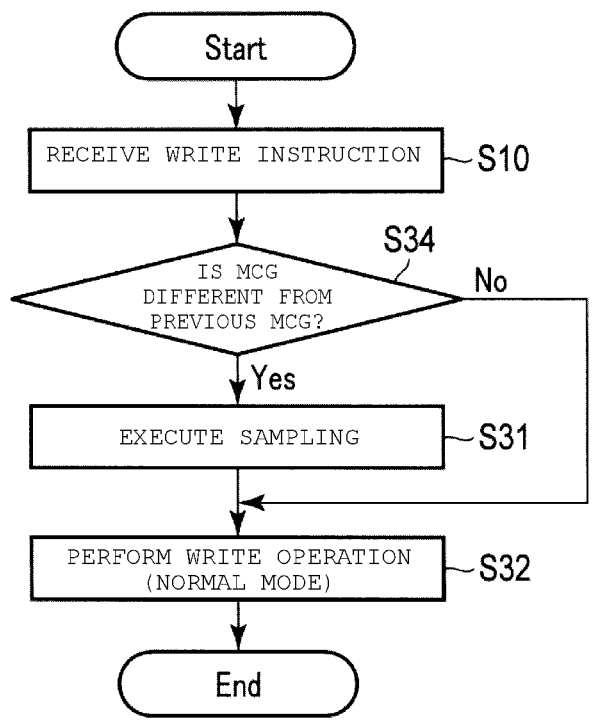
FIG. 15 is a flowchart illustrating a write operation in a semiconductor memory device according to a third example of the second embodiment.

As illustrated in FIG. 15, unlike the first and second examples, in a case where the selected memory cell group MCG is different from the previous memory cell group MCG (Step S34_Yes), the sequencer 17 executes sampling (Step S31). For example, in a case where write is made on an upper page after write is made on a lower page in the same memory cell group MCG or in a case where the column addresses CA is different from the previous column address CA in the same page, the same memory cell group MCG is selected.

2.4 Fourth Example

Next, a fourth example will be described. In the fourth example, in a case where the memory cell transistors MT within the NAND string 20 are classified into units of a plurality of word lines WL (in the following, referred to as a "zone ZN") and a different zone ZN is selected, the sampling mode is selected. In the following, only matters different from the first to third examples will be described.

2.4.1 Zone ZN

Figure 16:
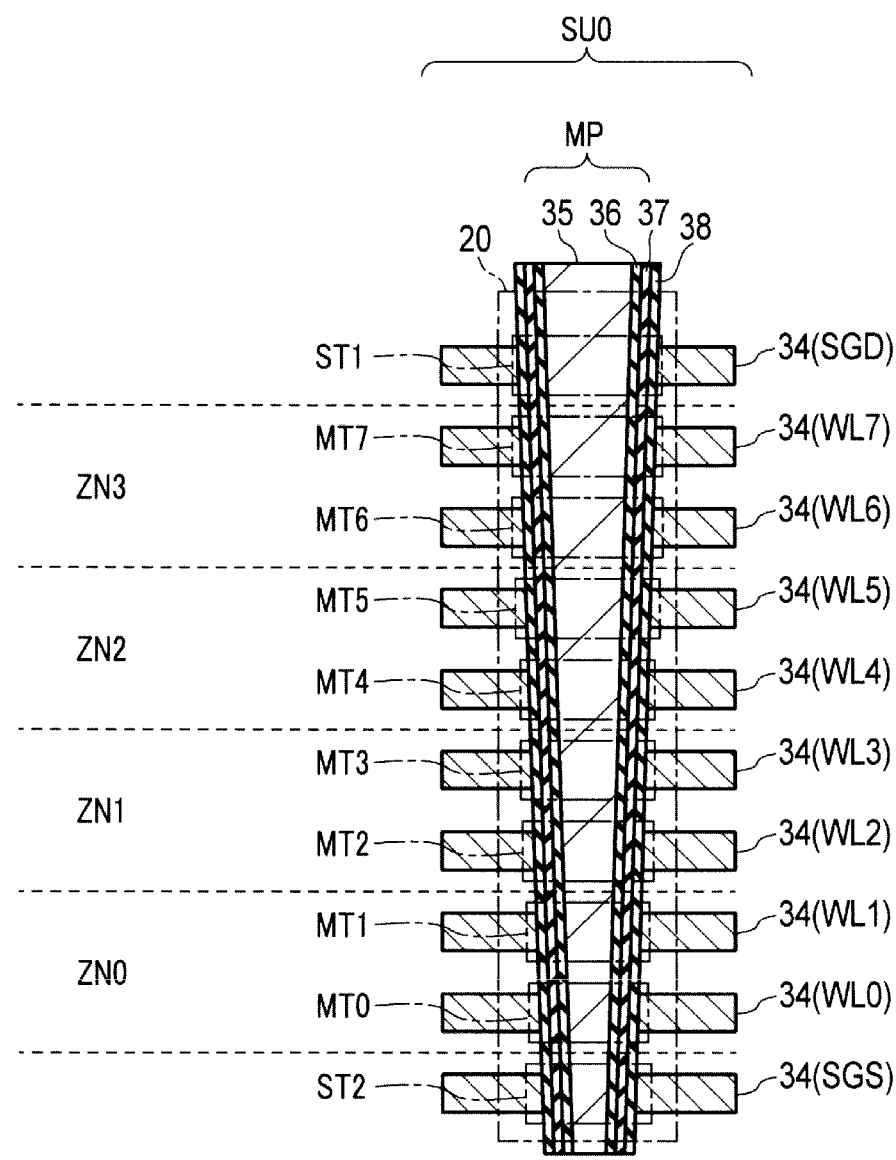
FIG. 16 is a cross-sectional view of a NAND string illustrating a zone in the semiconductor memory device according to a fourth example of the second embodiment.

First, a zone ZN will be described using FIG. 16. FIG. 16 is a diagram obtained by extracting the memory pillar MP and the wiring layer 34 in FIG. 4 of the first embodiment.

As illustrated in FIG. 16, the sequencer 17 classifies the word lines WL0 to WL7 into, for example, four zones ZN0 to ZN3 to be managed. In an example of FIG. 16, the word lines WL0 and WL1 belong to the zone ZN0, the word lines WL2 and WL3 belong to the zone ZN1, the word lines WL4 and WL5 belong to the zone ZN2, and the word lines WL6 and WL7 belong to the zone ZN3. Setting of the zone ZN can be arbitrarily changed. For example, the word lines WL0 to WL3 may be set as the zone ZN0 and the word lines WL4 to WL7 may be set as the zone ZN1.

2.4.2 Entire Flow of Write Operation in Semiconductor Memory Device

Next, the entire flow of the write operation in the semiconductor memory device will be described using FIG. 17.

Figure 17:
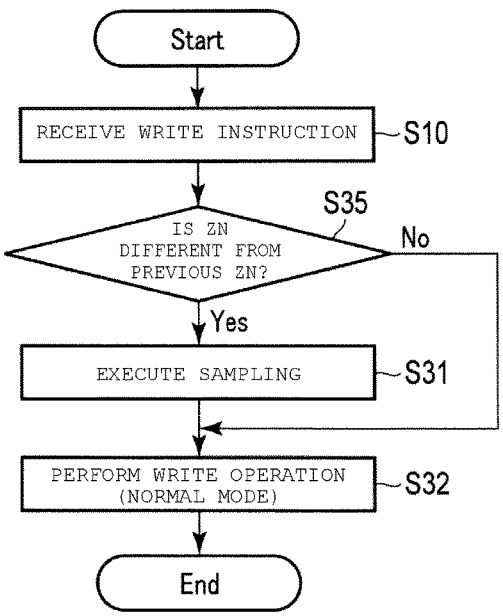
FIG. 17 is a flowchart illustrating a write operation in the semiconductor memory device according to the fourth example of the second embodiment.

As illustrated in FIG. 17, unlike the first to third examples, in a case where a zone ZN is different from the previous zone ZN (Step S35_Yes), the sequencer 17 executes sampling (Step S31).

2.5 Effect According to Second Embodiment

The first to fourth examples of the second embodiment can be applied to the first embodiment. Furthermore, the first to fourth examples can be combined as far as possible. For example, in a case where the same memory cell group MCG as the previous memory cell group MCG is selected in the string unit SU0 by combining the second example and the third example, the normal mode may be selected.

3. Third Embodiment

Next, a semiconductor memory device and a memory system according to a third embodiment will be described. In the third embodiment, a case where the controller 200 selects a write mode in the NAND flash memory 100 will be described. In the following, only the matters different from the first and second embodiments will be described.

3.1 Entire Flow of Write Operation in Memory System

First, the entire flow of the write operation in the memory system 1 will be described using FIG. 18. In an example of FIG. 18, in a case where the same row address RA as the previous row address RA is not selected, the controller 200 selects the sampling mode.

Figure 18:
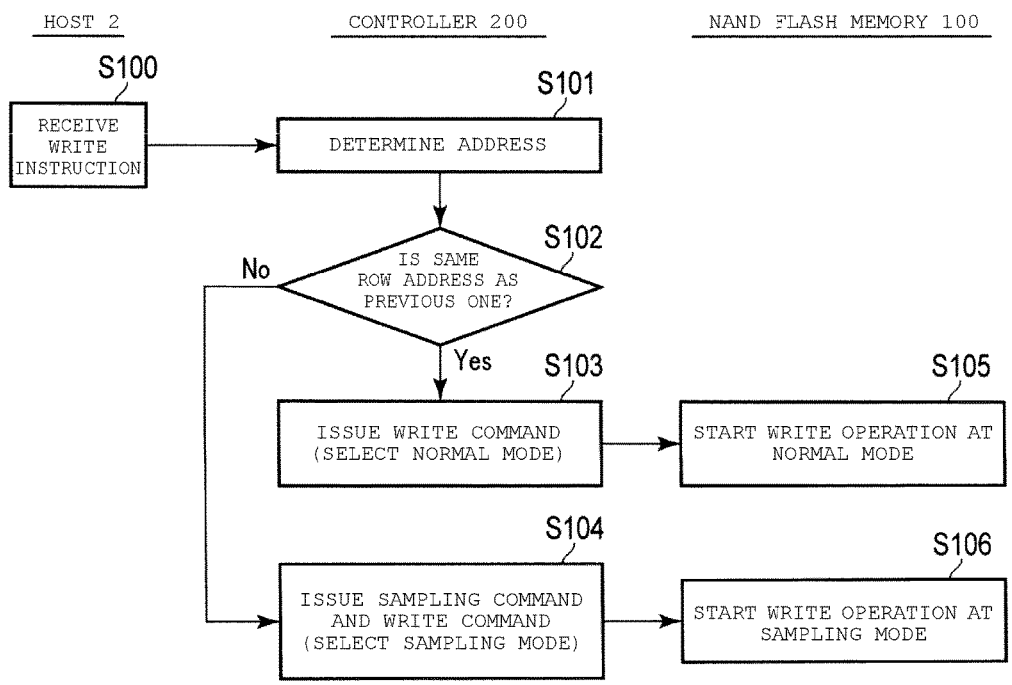
FIG. 18 is a flowchart illustrating a write operation in a memory system according to a third embodiment.

As illustrated in FIG. 18, first, the controller 200 receives a write instruction from the host device 2 (Step S100).

The processor 230 of the controller 200 determines an address ADD (row address RA and column address CA) to which data is to be written (Step S101).

In a case where the processor 230 refers to previous write information (address ADD) held by, for example, the built-in memory 220 and the same row address RA as the previous row address RA is selected (Step S102_Yes), the processor 230 selects the normal mode and issues a write command. The processor 230 transmits a write instruction (write command, address ADD, and data DAT) to the NAND flash memory 100 through the NAND interface circuit 250 (Step S103).

Then, the sequencer 17 selects the normal mode and starts the write operation based on the write instruction received from the controller 200 (Step S105). In this case, the write operation in the NAND flash memory 100 is the same as that in and after Step S13 of FIG. 9 and FIG. 10 in the first embodiment.

On the other hand, in a case where the row address RA different from the previous row address RA is selected (Step S102_Yes), the processor 230 selects the sampling mode and issues a sampling command. The processor 230 transmits a write instruction including a sampling command (i.e., sampling command, write command, address ADD, and data DAT) to the NAND flash memory 100 through the NAND interface circuit 250 (Step S104).

Then, the sequencer 17 selects the sampling mode and starts the write operation based on the sampling command received from the controller 200 (Step S106). In this case, the write operation in the NAND flash memory 100 is the same as that in and after Step S12 of FIG. 9 and FIG. 10 in the first embodiment. The sequencer 17 is shifted to the normal mode and continues the write operation, after calculating the programming voltage VPGM_SV by sampling.

In a case where the sequencer 17 holds a plurality of registers REG, the processor 230 selects a suitable register REG and transmits the write instruction. More specifically, in a case of the normal mode, the processor 230 selects the register REG holding the voltage value of the voltage VPGM_SV corresponding to a selected page and the normal mode and transmits the write instruction. In this case, in the NAND flash memory 100, the same write operation as that in and after Step S13 of FIG. 9 and FIG. 10 in the first embodiment is performed using the voltage value of the voltage VPGM_SV held in the selected register REG. In a case of the sampling mode, the processor 230 selects the register REG for storing the sampling result and the sampling mode, and transmits the write instruction. In this case, the voltage value of the voltage VPGM_SV calculated at the sampling mode is held in the selected register REG and the voltage value of the voltage VPGM_SV held in the non-selected register REG is not updated.

3.2 Operation of Controller in Write Operation

Next, two example of operations of the controller 200 at the time of the write operation will be described using FIG. 19 and FIG. 20. In an example of FIG. 19, the write operation in a case where the controller 200 does not designate the register REG and selects the sampling mode is illustrated. In an example of FIG. 20, the write operation in a case where the controller 200 designates the register REG and selects the sampling mode is illustrated.

First, a case where the controller 200 does not designate the register REG will be described. For example, in a case where the sequencer 17 includes a single register REG and the register REG can hold only a single voltage VPGM_SV, the controller 200 does not designate the register REG.

Figure 19:
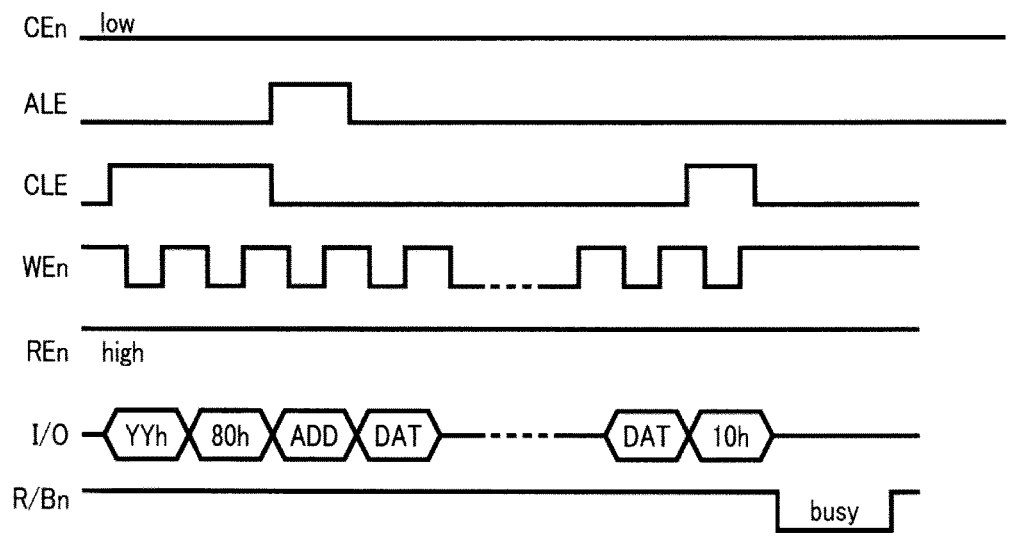
FIG. 19 is a timing chart illustrating a command sequence in a case where a controller provided in the memory system according to the third embodiment does not designate a register.

As illustrated in FIG. 19, first, the processor 230 outputs a sampling command "YYh" notifying execution of sampling and a command "80h" notifying execution of a write operation to the NAND flash memory 100 and asserts the command latch enable signal CLE by causing it to become "H" level.

Next, the processor 230 outputs the address "ADD" and asserts the address latch enable signal ALE by causing it to become "H" level. In an example of FIG. 19, although the address is illustrated in FIG. 19 as having one cycle, a plurality of cycles may be allocated to the address in order to transmit the column address CA and the row address RA.

Next, the processor 230 outputs the number of cycles needed for programming data "DAT".

Furthermore, the processor 230 outputs a write command "10h" to instruct execution of write and asserts the command latch enable signal CLE by causing it to become "H" level.

The command, the address, and the piece of data are stored in the register 15 according to example of the NAND flash memory 100.

The sequencer 17 selects the sampling mode in response to the sampling command "YYh". The sequencer 17 starts the write operation in response to the write command "10h" and the NAND flash memory 100 becomes a busy state (R/Bn="L").

When the write operation is completed, the NAND flash memory 100 becomes a ready state and the ready/busy signal R/Bn returns to the "H" level.

Next, a case where the controller 200 designates the register REG will be described. For example, in a case where the sequencer 17 includes a plurality of registers REG, the controller 200 designates the register REG corresponding to the selected page.

Figure 20:
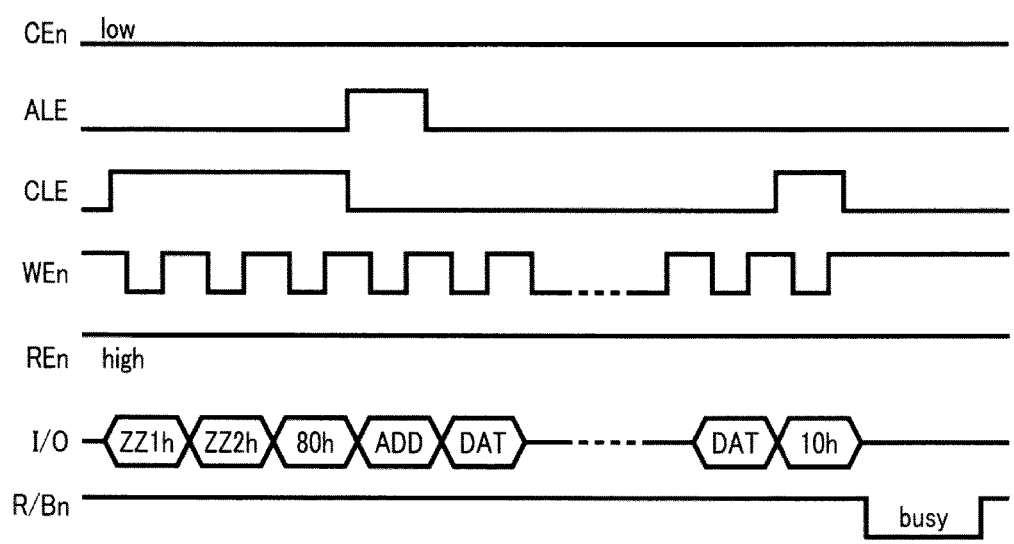
FIG. 20 is a timing chart illustrating a command sequence in a case where the controller provided in the memory system according to the third embodiment designates a register.

As illustrated in FIG. 20, first, the processor 230 outputs a command "ZZ1h" notifying designation of the register REG, a command "ZZ2h" notifying a write mode and a register REG, and a command "80h" notifying execution of a write operation to the NAND flash memory 100 and asserts the command latch enable signal CLE by causing it to become a "H" level. For example, the command ZZ2h is a one cycle signal, the sampling mode or the normal mode is selected by using one bit among 8-bit data of the "ZZ2h", and the register REG is selected using the remaining bits. The command "ZZ2h" may be an address or data.

Next, the processor 230 outputs the address "ADD", programming data "DAT", the write command "10h" to instruct execution of write similarly as in FIG. 19.

3.3 Effect of Third Embodiment

According to the configuration of the third embodiment, it is possible to obtain the same effect as that of the first and second embodiments.

In the third embodiment, a case where the processor 230 selects the sampling mode when the row addresses RA are the same is described, but is not limited thereto. The sampling mode selection operation by the sequencer 17 described in first and second embodiments may be performed by the processor 230. Furthermore, the first to third embodiments are combined to allow the controller 200 and the NAND flash memory 100 to respectively select the sampling mode under the different conditions.

4. Fourth Embodiment

Next, a semiconductor memory device and a memory system according to a fourth embodiment will be described. In the fourth embodiment, a case where the controller 200 selects sampling according to the number of rewrite times (the number of times write/erase is repeated) of the selected block BLK will be described. In the following, only the matters different from the first to third embodiments will be described.

4.1 Entire Flow of Write Operation in Memory System

The entire flow of a write operation in a memory system 1 will be described using FIG. 21. In an example of FIG. 21, the controller 200 selects the sampling mode according to the number of times of rewrite performed after sampling which was previously performed.

Figure 21:
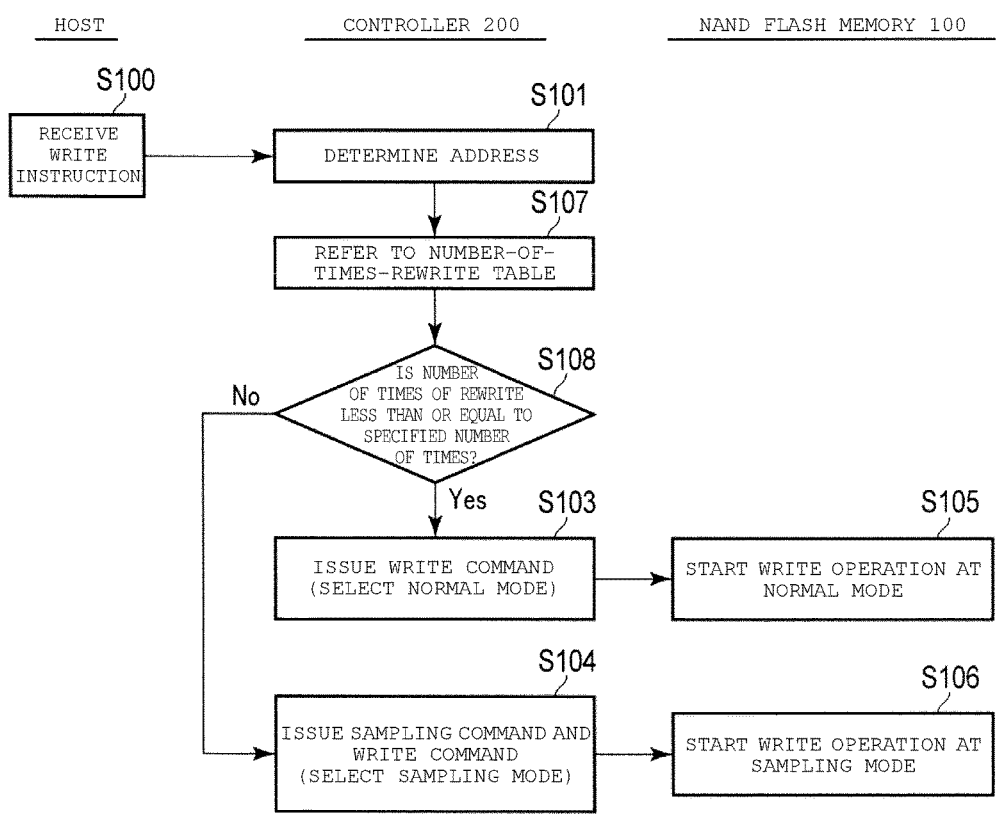
FIG. 21 is a flowchart illustrating a write operation in a memory system according to a fourth embodiment.

As illustrated in FIG. 21, first, the controller 200 receives a write instruction from the host device 2 (Step S100).

The processor 230 of the controller 200 determines an address ADD (row address RA and column address CA) for data write (Step S101).

The processor 230 refers to, for example, a number-of-times-of-rewrite table provided in, for example, the built-in memory 220 (Step S107). In the-number-of-times-of-rewrite table, for example, the number of times of rewrite after sampling is made is stored for each block BLK. The number of rewrite times held in the-number-of-times-of-rewrite table may be configured in unit of a word line WL or in unit of a string unit SU, and can be arbitrarily set. In the number of times of rewrite table, for example, a total number of rewrite times performed after shipment may be stored. In this case, each time when the number of rewrite times reaches a plurality of specified number of times (for example, 1000 times, 5000 times, . . . ) which is set in advance, sampling may be performed. Furthermore, a number-of-times-of-erase table in which the number of erase times for each block BLK is held may be provided in the built-in memory 220.

In a case where the number of rewrite times is less than or equal to a specified number of times (Step S107_Yes), similar to the third embodiment, the processor 230 selects a normal mode and issues a write command. The processor 230 transmits the write instruction to the NAND flash memory 100 (Step S103).

Then, the sequencer 17 selects the normal mode and starts a write operation (Step S105).

On the other hand, in a case where the number of rewrite times is greater than the specified number of times (Step S107_No), the processor 230 selects a sampling mode and issues a sampling command and a write command similar to the third embodiment. The processor 230 transmits a write instruction including the sampling command to the NAND flash memory 100 (Step S104).

Then, the sequencer 17 selects a sampling mode and starts a write operation (Step S106).

4.2 Effect of Fourth Embodiment

According to the configuration of the fourth embodiment, it is possible to obtain the same effect as that of the first to third embodiments.

Furthermore, according to the configuration of the fourth embodiment, even in a case where write and erase are repeated such that deterioration in characteristics of the memory cell transistor MT is caused, it is possible to set the optimum programming voltage. Accordingly, it is possible to enhance processing capability of the semiconductor memory device and the memory system.

5. Modification Example or the Like

The semiconductor memory device according to the first to fourth embodiments includes a first memory cell group (MCG) including a plurality of first memory cells, a word line (WL) connected to the plurality of first memory cells in common, and a control circuit (17) that controls a write operation having a first mode (e.g., sampling mode) at which a first program loop including first programming and first verification is repeated and a second mode (e.g., normal mode) at which a second program loop including second programming and second verification is repeated. In a case where the first mode and the second mode are sequentially executed, the control circuit, in the first program loop, repeats first verification while stepping up a second voltage (VCG_SV) to be applied to the word line until the number of OFF-cells of the first memory cells becomes less than or equal to a threshold value after first programming is executed by applying a first voltage (VSV) to the word line, determines a third voltage (VPGM_SV) lower than the first voltage based on the first voltage and the number of times the first verification is repeated, and in the second program loop for a first time, executes second verification by applying a fourth voltage (VCG_AV) lower than the second voltage to the word line after second programming is executed by applying the third voltage to the word line.

By applying the first to fourth embodiments, it is possible to provide a semiconductor memory device capable of enhancing processing capability.

Embodiments are not limited to embodied forms described above and various modifications can be made thereto.

5.1 First Modification Example

For example, the first to fourth embodiments may be applied to a memory cell transistor MT capable of holding data of 8-value (three bits). One example will be described using FIG. 22. In the following, only the matters different from FIG. 7 of the first embodiment will be described.

As illustrated in FIG. 22, the sequencer 17 executes "0" write using the voltage VSV by targeting, for example, the memory cell transistors MT for "D" write to "G" write. In this case, the memory cell transistors MT for Er" write to "C" write become to a state of write inhibition. As a result, for example, threshold voltages of many memory cell transistors MT for "D" write to "G" write are shifted so greatly to reach the "C" level. In this case, the voltage VCG_SV is set to, for example, a voltage which is greater than or equal to the voltage VCG_CV and less than the voltage VCG_DV.

5.2 Other Modification Examples

For example, the first to fourth embodiments can be combined as far as possible. For example, the first embodiment may be combined with the fourth embodiment.

Furthermore, in the first to fourth embodiments, the sense amplifier module 12 may be a current sense type sense amplifier module or a voltage sense type sense amplifier module sense.

Furthermore, the first to fourth embodiments can be applied to a planar NAND flash memory in which memory cells are disposed on a semiconductor substrate without being limited to the three-dimensional stacked NAND flash memory.

Furthermore, the first to fourth embodiments can be applied to a semiconductor memory device using other types of memories without being limited to a NAND flash memory.

Furthermore, meaning of "connection" between elements in the first to fourth embodiments includes a state in which elements are indirectly connected with each other by interposing any element, for example, a transistor or a resistor, therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the respective embodiments of the present disclosure, the following matters may be adopted. For example, when the memory cell transistor MT is able to hold 2-bit (four values) data and respective threshold voltage levels when any of four values is held are set as Er level (erase level), A level, B level, and C level in order from the threshold value level, (1) In a read operation, a voltage to be applied to a word line selected for a read operation of the A level is, for example, between 0 V and 0.55 V, but is not limited thereto and may include any of ranges between 0.1 V and 0.24 V, between 0.21 V and 0.31 V, between 0.31 V and 0.4 V, between 0.4 V and 0.5 V, and between 0.5 V and 0.55 V.

A voltage to be applied to a word line selected for a read operation of the B level is, for example, between 1.5 V and 2.3 V, but is not limited thereto and may include any of ranges between 1.65 V and 1.8 V, between 1.8 V and 1.95 V, between 1.95 V and 2.1 V, and between 2.1 V and 2.3 V.

A voltage to be applied to a word line selected for a read operation of the C level is, for example, between 3.0 V and 4.0 V, but is not limited thereto and may include any of ranges between 3.0 V and 3.2V, between 3.2 V and 3.4 V, between 3.4 V and 3.5 V, between 3.5 V and 3.6 V, and between 3.6 V and 4.0 V.

The time (tR) for a read operation may be, for example, between 25 µs and 38 µs, between 38 µs and 70 µs, and between 70 µs and 80 µs.

(2) The write operation includes the program operation and a verification operation as described above. In the write operation, a voltage to be applied at first to a word line selected at the time of the program operation is, for example, between 13.7 V and 14.3 V, but is not limited thereto and may include any of ranges, for example, between 13.7V and 14.0 V and between 14.0 V and 14.6 V.

A voltage to be applied at first to a selected word line when write is made to an odd-numbered word line and a voltage to be applied at first to a selected word line when write is made to an even-numbered the word line may be varied.

When the program operation is performed by using an incremental step pulse program (ISPP) scheme, a voltage, for example, an approximately 0.5 V may be used as a step-up voltage.

A voltage to be applied to a non-selected word line may be, for example, between 6.0 V and 7.3 V, but is not limited thereto, may be set, for example, between 7.3 V and 8.4 V, and may be set to be less than or equal to 6.0 V.

A path voltage to be applied may be varied according to whether the non-selected word line is an odd-numbered word line or an even-numbered word line.

The time (tProg) for a write operation may be, for example, between 1700 µs and 1800 µs, between 1800 µs and 1900 µs, and between 1900 µs and 2000 µs.

(3) In the erase operation, a voltage to be applied at first to a well, which is formed on an upper portion of a semiconductor substrate and the memory cell is disposed above the well, is, for example, between 12 V and 13.6 V, but is not limited thereto and may include any of ranges, for example, between 13.6 V and 14.8 V, between 14.8 V and 19.0 V, between 19.0 V and 19.8 V, and between 19.8 V and 21 V.

The time (tErase) for the erase operation may be, for example, between 3000 µs and 4000 µs, between 4000 µs and 5000 µs, and between 4000 µs and 9000 µs.

(4) A structure of the memory cell may be a structure described in the following. That is, the memory cell includes a charge storage layer disposed on a semiconductor substrate (silicon substrate) through a tunnel insulation film having a film thickness of 4 to 10 nm. The charge storage layer may have a stacked structure formed with an insulation film, such as SiN or SiON, having a film thickness of 2 to 3 nm, and a polysilicon film having a film thickness of 3 to 8 nm. Metal such as Ru may be added to the polysilicon film. An insulation film may be formed on the charge storage layer. The insulation film may include a silicon oxide film having a film thickness of 4 to 10 nm and sandwiched between, for example, a lower layer of High-k film having a film thickness of 3 to 10 nm and a higher layer of High-k film having a film thickness of 3 to 10 nm. The High-k film includes HfO or the like. The film thickness of silicon oxide film may be thicker than the film thickness of the High-k film. A control electrode having a film thickness of 30 to 70 nm is formed on the insulation film through a material which has a film thickness is 3 to 10 nm. Here, such a material is a metal oxide film such as TaO or a metal nitride film such as TaN. W or the like may be used in the control electrode.

An air gap may be formed between the memory cells.

What is claimed is:

1. A semiconductor memory device comprising:
   a memory cell array having a plurality of memory cell groups, each of which includes a plurality of memory cells, the memory cell groups including a first memory group including first memory cells and a second memory group including second memory cells;
   a first word line that is connected to each of the first memory cells;
   a second word line that is connected to each of the second memory cells; and
   a control circuit configured to execute a first write operation targeting the first memory cells in a first mode in which the control circuit executes at least a first programming operation on the first memory cells followed by a multiple number of first verification operations to verify the first programming operation, and then in a second mode, in which the control circuit executes a second programming operation on the first memory cells followed by a second verification operation to verify the second programming operation, wherein a programming voltage applied to the first word line during the second programming operation is less than a programming voltage applied to the first word line during the first programming operation, and is adjusted based on a number of first verification operations.

2. The semiconductor memory device according to claim 1, wherein the programming voltage applied to the first word line during the second programming operation is adjusted further based on a number of first programming operations executed during the first mode.

3. The semiconductor memory device according to claim 2, wherein the programming voltage applied to the first word line during the second programming operation is a first voltage when the number of first programming operations is N1 and the number of first verification operations is N2, and a second voltage when the number of first programming operations is N1 and the number of first verification operations is N3, and the first voltage is greater than the second voltage if N2<N3, and less than the second voltage if N2>N3.

4. The semiconductor memory device according to claim 2, wherein the programming voltage applied to the first word line during the second programming operation is a third voltage when the number of first programming operations is N4 and the number of first verification operations is N5, and a fourth voltage when the number of first programming operations is N6 and the number of first verification operations is N5, and the first voltage is greater than the second voltage if N4>N6, and less than the second voltage if N4<N6.

5. The semiconductor memory device according to claim 1, wherein the control circuit is configured to:

execute a second write instruction, which is the next write instruction after the first write instruction, in accordance with whether or not the second write operation targets the first memory cells.

6. The semiconductor memory device according to claim 5, wherein the control circuit is configured to:

if the second write operation does not target the first memory cells, execute the second write instruction in the first mode, and then in the second mode.

7. The semiconductor memory device according to claim 5, wherein the control circuit is configured to:

store the programming voltage applied to the first word line during the second programming operation, and if the second write operation targets the first memory cells, execute the second write instruction in a third mode, in which the control circuit executes a third programming operation on the first memory cells followed by a third verification operation to verify the third programming operation, wherein a programming voltage applied to the first word line during the third programming operation is the same as the stored programming voltage.

8. The semiconductor memory device according to claim 1, wherein the control circuit is configured to:

execute a second write instruction, which is the next write instruction after the first write instruction, in accordance with whether or not the second write operation targets memory cells that are connected to the first word line or a different word lines that is in a same zone of word lines as the first word line.

9. The semiconductor memory device according to claim 1, wherein the control circuit is configured to:

execute a second write instruction, which is the next write instruction after the first write instruction, in accordance with whether or not the second write operation targets memory cells that are in a same block as the first memory cells.

10. The semiconductor memory device according to claim 1, wherein the control circuit is configured to:

execute a second write instruction, which is the next write instruction after the first write instruction, in accordance with whether or not the second write operation targets memory cells that has a same row address as the first memory cells.

11. The semiconductor memory device according to claim 1, wherein the control circuit is configured to:

execute a second write instruction, which is the next write instruction after the first write instruction, in accordance with whether or not the second write operation targets memory cells that have been rewritten a number of times in excess of a threshold number of rewrites.

12. A semiconductor memory device comprising:

a memory cell array having a plurality of memory cell groups, each of which includes a plurality of memory cells that are connected to a common word line; and a control circuit configured to execute consecutive first and second write operations by executing at least a first programming operation on memory cells targeted by the first write operation followed by a multiple number of first verification operations to verify the first programming operation, executing a second programming operation on the memory cells targeted by the first write operation followed by a second verification operation to verify the second programming operation, storing the programming voltage applied during the second programming operation, to a word line connected to the memory cells targeted by the first write operation, and executing the second write operation in accordance with whether or not the second write operation meets a condition for using the stored programming voltage.

13. The semiconductor memory device according to claim 12, wherein a programming voltage applied during the second programming operation is less than a programming voltage applied during the first programming operation, and is adjusted based on a number of first verification operations.

14. The semiconductor memory device according to claim 13, wherein upon determining that the second write operation does meet the condition for using the stored programming voltage, executing a third programming operation on memory cells targeted by the second write operation followed by a third verification operation to verify the third programming operation, and a programming voltage used during the third programming operation is the same as the stored programming voltage.

15. The semiconductor memory device according to claim 13, wherein upon determining that the second write operation does not meet the condition for using the stored programming voltage, executing at least a third programming operation on memory cells targeted by the second write operation followed by a multiple number of third verification operations to verify the third programming operation, and executing a fourth programming operation on the memory cells targeted by the second write operation followed by a fourth verification operation to verify the second programming operation.

16. The semiconductor memory device according to claim 12, wherein the condition is one of:

memory cells targeted by the second write operation is the same as the memory cells targeted by the first write operation;

a word line connected to the memory cells targeted by the second write operation is the same as a word line connected to the memory cells targeted by the first write operation;

a word line connected to the memory cells targeted by the second write operation is in a same zone as a word line connected to the memory cells targeted by the first write operation;

a row address of the memory cells targeted by the second write operation is the same as a row address of the memory cells targeted by the first write operation; and a number of rewrites performed on the memory cells targeted by the second write operation is less than a threshold number of rewrites.

17. A method of performing a write operation on a group of memory cells of a semiconductor memory device that are connected to a common word line, comprising:

(a) executing at least a first programming operation on the memory cells followed by a multiple number of first verification operations to verify the first programming operation;

(b) executing a second programming operation on the memory cells followed by a second verification operation to verify the second programming operation;

(c) storing the programming voltage applied during the second programming operation, to the word line connected to the memory cells; and (d) upon completion of a first write operation that includes steps (a), (b), and (c), executing a next write operation in accordance with whether or not a second write operation meets a condition for using the stored programming voltage.

18. The method according to claim 17, wherein a programming voltage applied during the second programming operation is less than a programming voltage applied during the first programming operation, and is adjusted based on a number of first verification operations.

19. The method according to claim 18, further comprising:

upon determining that the second write operation does meet the condition for using the stored programming voltage, executing a third programming operation on memory cells targeted by the second write operation followed by a third verification operation to verify the third programming operation, and a programming voltage used during the third programming operation is the same as the stored programming voltage.

20. The method according to claim 18, wherein upon determining that the second write operation does not meet the condition for using the stored programming voltage, executing at least a third programming operation on memory cells targeted by the second write operation followed by a multiple number of third verification operations to verify the third programming operation, and executing a fourth programming operation on the memory cells targeted by the second write operation followed by a fourth verification operation to verify the fourth programming operation.

* * * * *